United States Patent
Martinis et al.

(10) Patent No.: US 12,082,335 B2
(45) Date of Patent: Sep. 3, 2024

(54) SUPERCONDUCTING FLEX CIRCUIT BOARDS HAVING METAL STRUCTURES FOR IMPROVED INTERFACING CHARACTERISTICS

(71) Applicant: Google LLC, Mountain View, CA (US)

(72) Inventors: John Martinis, Santa Barbara, CA (US); Xiaojun Trent Huang, Santa Barbara, CA (US); Bob Benjamin Buckley, Santa Barbara, CA (US)

(73) Assignee: GOOGLE LLC, Mountain View, CA (US)

( * ) Notice: Subject to any disclaimer, the term of this patent is extended or adjusted under 35 U.S.C. 154(b) by 184 days.

(21) Appl. No.: 17/476,612

(22) Filed: Sep. 16, 2021

(65) Prior Publication Data
US 2022/0087012 A1    Mar. 17, 2022

Related U.S. Application Data

(60) Provisional application No. 63/079,263, filed on Sep. 16, 2020.

(51) Int. Cl.
*H05K 1/02*    (2006.01)
*G06N 10/00*    (2022.01)
(Continued)

(52) U.S. Cl.
CPC .......... *H05K 1/0219* (2013.01); *G06N 10/00* (2019.01); *H03K 5/01* (2013.01); *H05K 1/028* (2013.01);
(Continued)

(58) Field of Classification Search
CPC .......... H05K 1/028; H05K 1/09; H05K 1/116; H05K 1/0219; H05K 1/0393; H05K 2201/09327; H05K 2201/0154
See application file for complete search history.

(56) References Cited

U.S. PATENT DOCUMENTS

| | | | | |
|---|---|---|---|---|
| 4,414,738 | A | * | 11/1983 | Jelks .................. H10N 60/0912 438/944 |
| 2019/0006572 | A1 | | 1/2019 | Falcon et al. |
| 2019/0006575 | A1 | | 1/2019 | Yamaguchi et al. |
| 2023/0130578 | A1 | | 4/2023 | Martinis |

FOREIGN PATENT DOCUMENTS

| | | |
|---|---|---|
| JP | H05299708 A | 11/1993 |
| JP | H05304224 A | 11/1993 |

(Continued)

OTHER PUBLICATIONS

International Search Report and Written Opinion for Application No. PCT/US2021/050634, mailed Dec. 23, 2021, 13 pages.

(Continued)

*Primary Examiner* — Hoa C Nguyen
*Assistant Examiner* — John B Freal
(74) *Attorney, Agent, or Firm* — DORITY & MANNING P.A.

(57) ABSTRACT

A flex circuit board can be used in transmitting signals in a quantum computing system. The flex circuit board can include at least one dielectric layer and at least one superconducting layer disposed on a surface of the at least one dielectric layer. The at least one superconducting layer can include a superconducting material. The superconducting material can be superconducting at a temperature less than about 3 kelvin. The flex circuit board can have at least one metal structure electroplated onto the at least one superconducting layer.

20 Claims, 9 Drawing Sheets

(51) Int. Cl.
  *H03K 5/01* (2006.01)
  *H05K 1/09* (2006.01)
  *H05K 1/11* (2006.01)
  *H05K 3/06* (2006.01)
  *H05K 3/18* (2006.01)

(52) U.S. Cl.
  CPC .............. *H05K 1/09* (2013.01); *H05K 1/116* (2013.01); *H05K 3/06* (2013.01); *H05K 3/188* (2013.01); *H05K 2201/0154* (2013.01)

(56) References Cited

FOREIGN PATENT DOCUMENTS

| JP | H06523621 A | 2/1994 | | |
|---|---|---|---|---|
| WO | WO-2018213494 A1 * | 11/2018 | ............. | G06N 10/00 |
| WO | WO 2019/050525 | 3/2019 | | |
| WO | WO-2019050525 A1 * | 3/2019 | ............. | G06N 10/00 |
| WO | WO 2019/131286 | 7/2019 | | |

OTHER PUBLICATIONS

Shubin et al., "Novel Packaging with Rematable Spring Interconnect Chips for MCM", $59^{th}$ Electronic Components and Technology Conference, May 26-29, 2009, San Diego, California, 7 pages.

Chow et al., "Pressure Contact Micro-Springs in Small Pitch Flip-Chip Packages", IEEE Transactions on Components and Packaging Technologies, vol. 29, No. 4, pp. 796-803.

Laird.com, "Flexible Foam Sheet Broadband Microwave Absorber", https://www.laird.com/sites/default/files/2021-01/RFP-DS-AN%2006242020.pdf, retrieved on Jan. 19, 2022, 2 pages.

International Preliminary Report on Patentability for Application No. PCT/US2021/050634, mailed Mar. 30, 2023, 9 pages.

* cited by examiner

SUPERCONDUCTING FLEX CIRCUIT BOARDS HAVING METAL STRUCTURES FOR IMPROVED INTERFACING CHARACTERISTICS

PRIORITY CLAIM

The present application claims the benefit of priority of U.S. Provisional Application Ser. No. 63/079,263, filed on Sep. 16, 2020, titled Superconducting Flex Circuit Boards having Metal Structures for Improved Interfacing Characteristics, which is incorporated herein by reference.

FIELD

The present disclosure relates generally to quantum computing systems, and, more particularly, to superconducting flex circuit boards having metal structures for improved interfacing characteristics for quantum computing applications.

BACKGROUND

Quantum computing is a computing method that takes advantage of quantum effects, such as superposition of basis states and entanglement, to perform certain computations more efficiently than a classical digital computer. In contrast to a digital computer, which stores and manipulates information in the form of bits, e.g., a "1" or "0," quantum computing systems can manipulate information using quantum bits ("qubits"). A qubit can refer to a quantum device that enables the superposition of multiple states, e.g., data in both the "0" and "1" state, and/or to the superposition of data, itself, in the multiple states. In accordance with conventional terminology, the superposition of a "0" and "1" state in a quantum system may be represented, e.g., as $a|0\rangle + b|1\rangle$. The "0" and "1" states of a digital computer are analogous to the $|0\rangle$ and $|1\rangle$ basis states, respectively of a qubit.

SUMMARY

Aspects and advantages of embodiments of the present disclosure will be set forth in part in the following description, or can be learned from the description, or can be learned through practice of the embodiments.

One example aspect of the present disclosure is directed to a flex circuit board for use in transmitting signals in a quantum computing system. The flex circuit board can include at least one dielectric layer and at least one superconducting layer disposed on a surface of the at least one dielectric layer. The at least one superconducting layer can include a superconducting material. The superconducting material can be superconducting at a temperature less than about 3 kelvin. The flex circuit board can have at least one metal structure electroplated onto the at least one superconducting layer.

Another example aspect of the present disclosure is directed to a method for making a flex circuit board for use in transmitting signals in a quantum computing system. The method can include depositing a first superconducting layer on a first side of a first dielectric layer. The method can include depositing a first metal film on the first superconducting layer. The method can include etching the first metal film to remove a first removed portion of the first metal film and to leave a first remaining portion of the first metal film. The method can include electroplating a metal structure onto the first remaining portion of the first metal film disposed on the first superconducting layer.

Another example aspect of the present disclosure is directed to a method of operating a quantum computing system including flex circuit boards. The method can include transmitting, by one or more classical processors, a control pulse to one or more superconducting signal lines. The one or more superconducting signal lines can be disposed in one or more flex circuit boards. The one or more flex circuit boards can include at least one metal structure electroplated onto the one or more superconducting signal lines. The method can include transmitting, by the one or more signal lines, the control pulse through the one or more flex circuit boards to one or more quantum computing devices. The method can include applying, by the one or more quantum computing devices, the control pulse to implement at least one quantum operation based at least in part on the control pulse.

Other aspects of the present disclosure are directed to various systems, apparatuses, non-transitory computer-readable media, user interfaces, and electronic devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which refers to the appended figures, in which.

DETAILED DESCRIPTION

Figure 1:
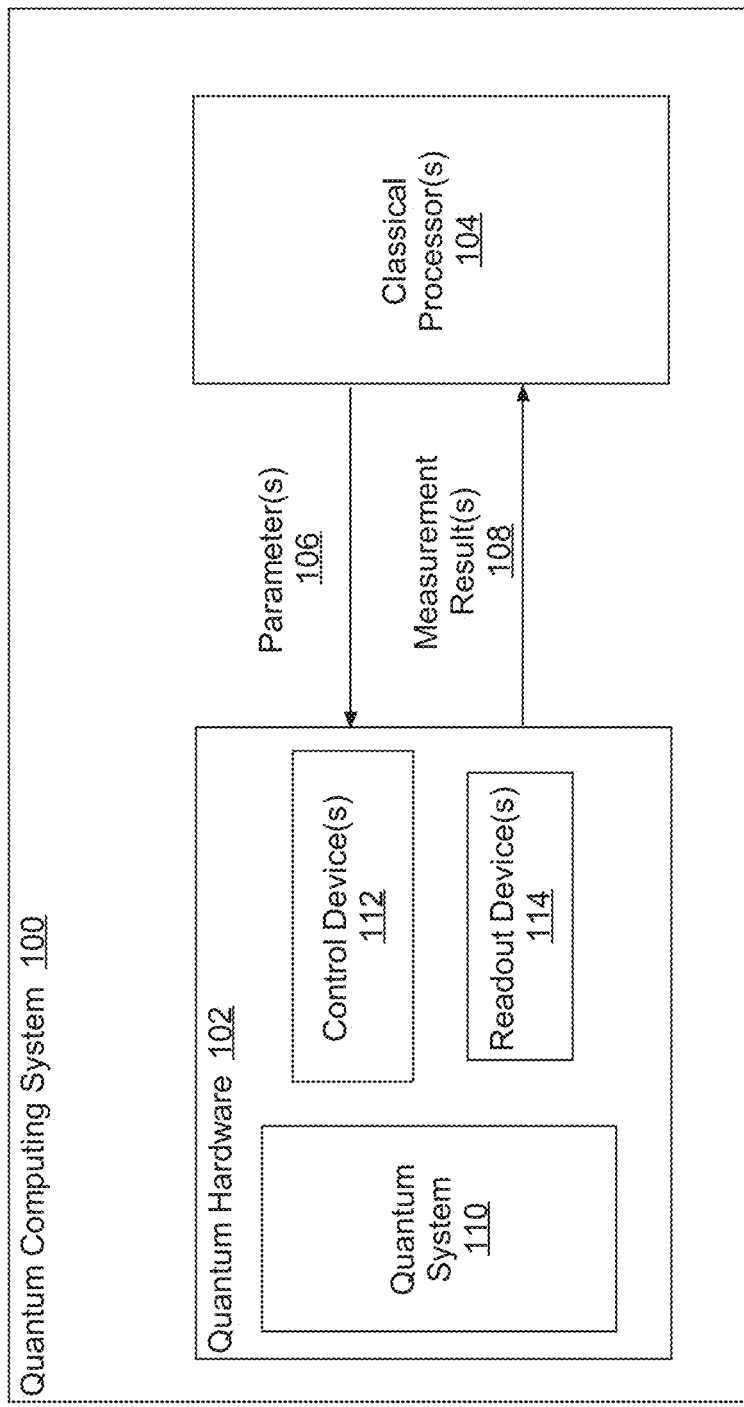
FIG. 1 depicts an example quantum computing system according to example embodiments of the present disclosure.

Example aspects of the present disclosure are directed to superconducting flex circuit boards, such as superconducting flex circuit boards useful in quantum computing systems having improved signal transmissions. One challenge in quantum computing relates to communications between a supercooled quantum system including quantum hardware (e.g., qubits) and a classical computing system (e.g., a binary computing system). Quantum computing systems can be at least partially controlled by a classical computing system. The classical computing system can be kept separate from the quantum hardware. For instance, the quantum hardware can be disposed in a vacuum chamber (e.g., in a vacuum formed by the vacuum chamber) and/or the classical computing system can be disposed outside of the vacuum chamber (e.g., outside of a vacuum formed by the vacuum chamber). The vacuum chamber may provide a temperature gradient between the classical computing system, which may operate at about room temperature, and the quantum hardware, which may operate at about absolute zero (e.g., less than about 10 millikelvin).

Quantum computing systems can require fast and robust communications between the classical computing system and the quantum system (e.g., qubits) to precisely and reliably implement quantum gate operations and/or quantum state measurements. To address this requirement, many systems employ physical signal lines, such as wires, between the classical computing system and quantum system.

Increasing complexity of quantum hardware (e.g., greater number of qubits) can present challenges with managing the physical signal lines between the classical computing system and quantum hardware. For instance, in some cases, each qubit can require one or more signal lines to transmit signals to and/or from the qubit. For instance, the number of required signal lines can grow at least near-linearly, if not greater than linearly, with the number of qubits in the quantum system. For instance, in some cases, four signal lines can be required for each qubit, even if some or all of the signal lines are multiplexed. Increasing density of quantum hardware can thus contribute to increasing density of signal lines and/or interconnects required between signal lines and components of the quantum computing system, such as the quantum hardware, an end (e.g., entrance) of the vacuum chamber, feed-throughs for different cooling stages, and/or other components. In addition, increasing complexity of quantum hardware can contribute to greater susceptibility to cross-talk, noise, interference, etc. Thus, the signal lines must provide sufficient performance for other considerations, such as thermal conductivity, noise and/or crosstalk robustness, and others.

As one example, many quantum computing applications employ superconducting qubits that achieve superconductivity, or zero electrical resistance, at a temperature around approximately absolute zero, or about 0 kelvin, such as less than about 3 kelvin. Thus, one challenge associated with quantum computing includes cooling quantum hardware with the superconducting qubits to a temperature at which the superconducting qubits achieve superconductivity. For example, in some cases, the superconducting qubits must be cooled to less than about 0.1 kelvin (K), such as less than about 0.02 kelvin, or 20 millikelvin (mK). Typically, the classical computing system can be maintained at a higher temperature than the quantum hardware such as, for instance, at about room temperature. Physical signal lines may connect to the quantum hardware and thus form a thermal conductor between the classical computing system and quantum hardware. The physical signal lines can reduce the efficiency of a cooling system (e.g., a cryogenic cooling system) that is configured to cool the quantum hardware and/or other components of the quantum computing system. While even one signal line can thus cause increased cooling requirements, this problem can become more significant as quantum hardware continues to grow in complexity. Thus, signal lines coupling the quantum hardware to the classical computing system can desirably be physically small (e.g., densely arranged), provide a low heat load, provide low electrical dissipation, and/or provide other desirable thermal characteristics.

As another example, it can be desirable to accurately drive qubits with signals from the signal lines. For instance, signal reflections from components of the quantum computing system can negatively affect performance of the quantum hardware. Thus, the signal lines can desirably have low reflectivity (e.g., less than about 40 dB). Additionally and/or alternatively, the signal lines can desirably provide low distortion (e.g., pulse distortion) such that control signals are accurately transmitted through the signal line. Signal lines with low distortion can provide improved accurate control signal implementations and/or quantum algorithm execution at the quantum hardware and/or accurate readouts from the quantum hardware. Additionally and/or alternatively, the signal lines can desirably provide low crosstalk (e.g., less than about 80 dB) between distinct signal lines and/or other components. Signal lines providing low crosstalk can provide improved isolated qubit communications, such as providing that signals on a signal line intended for one qubit are isolated from other qubits and/or contribute to reduced noise at each additional signal line.

As another example, noise and/or other external factors can impact performance of a quantum computing system. Signal lines coupling the quantum hardware to the classical computing system can desirably provide little interference in an environment of the quantum hardware. For example, signal lines can desirably emit few to no thermal photons and/or contribute to other factors that could interfere with operation of the quantum hardware. Additionally and/or alternatively, the quantum computing system can desirably block external thermal photons, signal noise, and/or other external factors from interfering with operation of the quantum hardware (e.g., by providing filtering).

Thus, some quantum computing systems can include one or more flex circuit boards including one or more signal lines. The flex circuit board(s) can be configured to transmit signals by the one or more signal lines (e.g., through a vacuum chamber) to couple one or more classical processors to quantum hardware. The flex circuit board(s) can include a plurality of signal lines and can provide a significantly improved signal line density, in addition to providing improved isolation, reduced thermal conductivity, and/or improved scalability. For instance, including flex circuit boards to couple the classical processors to the quantum hardware can provide for infrastructure that reliably scales to the increasingly greater numbers of qubits that are achieved and/or expected in contemporary and/or future quantum computing systems.

Including flex circuit board(s) in a quantum computing system can provide for improved signal communications within the quantum computing system. Furthermore, the flex circuit board(s) can include superconducting material, such as material that experiences superconductivity at a temperature below about 3 kelvin, to further improve signal communications, especially at colder regions of a quantum computing system. However, interfacing between the flex circuit board(s) can be complicated by the inclusion of some superconducting materials. For instance, difficulties can be encountered in forming quality electrical contacts between components including the superconducting materials, such as distinct flex circuit boards. As one example, many superconducting materials may not be malleable enough and/or otherwise suitable for easily forming precise interconnects between, for example, signal lines.

Systems and methods according to example aspects of the present disclosure can provide solutions for these and/or other problems. According to example aspects of the present disclosure, a flex circuit board for use in transmitting signals in a quantum computing system can include at least one dielectric layer and at least one superconducting layer disposed on a surface of the at least one dielectric layer. The at least one superconducting layer can include superconducting material. For instance, the superconducting material can be superconducting at a temperature less than about 3 kelvin, such as about 1 kelvin, such as about 20 millikelvin. As one example, the superconducting material can be niobium. In some embodiments, the dielectric layer can include polyimide.

The flex circuit board can have at least one metal structure electroplated onto the at least one superconducting layer. For instance, the metal structure can be an interconnect pad. The interconnect pad can allow for external coupling to the superconducting layer, such as by another flex circuit board, a wire, etc. The interconnect pad can improve interfacing with the superconducting layer, such as with signal lines in the superconducting layer. For instance, the interconnect pad can be configured to couple to at least one signal line of the superconducting layer. In some embodiments, the at least one superconducting layer has a first end and an opposed second end. A first interconnect pad can be disposed on the first end of the at least one superconducting layer and a second interconnect pad can be disposed on the second end of the at least one superconducting layer. Additionally and/or alternatively, in some embodiments, the metal structure can be a via plate. The via plate can coat or provide a coating for a via extending through at least a portion of the flex circuit board. For example, the via plate can coat a via extending through at least the at least one dielectric layer and the at least one superconducting layer. In some embodiments, the at least one metal structure can include copper.

In some embodiments, at least one adhesion layer can be disposed between the at least one superconducting layer and the at least one metal structure. For example, the adhesion layer can be a portion of the metal structure, such as a portion of the metal structure formed by depositing the adhesion layer prior to electroplating the at least one metal structure. Additionally and/or alternatively, the adhesion layer can be an additional adhesion layer configured to adhere the metal structure to the superconducting layer. In some embodiments, the at least one adhesion layer is formed by etching a deposited metal film. The adhesion layer can be formed by any suitable material, such as, for example, copper, titanium, etc.

In some embodiments, the superconducting layers can include a first ground layer, a second ground layer, and a signal line layer disposed between the first ground layer and the second ground layer. The signal line layer can include one or more signal lines. Additionally and/or alternatively, the dielectric layers can include a first dielectric layer disposed between the first ground layer and the signal line layer and a second dielectric layer disposed between the second ground layer and the signal line layer. In some embodiments, the metal structures can include a plurality of interconnect pads that are disposed on each end of the first ground layer, the second ground layer, and/or the signal line layer. In some embodiments, the at least one metal structure can include a via plate, The via plate can coat a via extending through the first ground layer, the first dielectric layer, the signal line layer, the second dielectric layer, and the second ground layer.

Another example aspect of the present disclosure is directed to a method for making a flex circuit board for use in transmitting signals in a quantum computing system. The method can include depositing a superconducting layer (e.g., a first superconducting layer) on a first side of a dielectric layer (e.g., a first dielectric layer). For example, in some embodiments, the superconducting layer can be a ground layer and/or a superconducting signal line layer including one or more signal lines. The superconducting layer can be or can include superconducting material, such as material that is superconducting at a temperature below about 3 kelvin, such as about 1 kelvin, such as about 20 millikelvin. As one example, the superconducting material may be or include niobium. The dielectric layer can be any suitable dielectric material, such as a flexible dielectric material, such as polyimide.

The method can include depositing a metal film (e.g., a first metal film) on the superconducting layer. For instance, the metal film can be deposited over a greater area than an eventual metal structure, such as an entire surface of the superconducting layer. The metal film can include at least one layer. As one example, the metal film can be a same material as the eventual metal structure. As one example, the metal film can be or include copper. For instance, the metal film can be a first portion of the eventual metal structure that is formed by depositing. The metal film can serve to prevent formation of contaminants (e.g., oxides) and/or adhere the metal structure to the superconducting layer. Additionally and/or alternatively, the metal film can include an additional adhesion layer having a different material from the eventual metal structure, such as titanium. The additional adhesion layer can improve adherence of the metal structure and/or metal film to the superconducting layer.

The method can include etching the metal film to remove a removed portion (e.g., a first removed portion) of the metal film and to leave a remaining portion (e.g., a first remaining portion) of the metal film. For example, the remaining portion of the metal film may be masked such that only the removed portion of the metal film is etched. The removed portion of the metal film may be etched such that the remaining portion of the metal film is about the same size, shape, and/or area as the metal structure. For example, the etching may trim away unnecessary regions of the metal film.

The method can include electroplating a metal structure (e.g., a first metal structure) onto the remaining portion of the metal film. For example, a portion of the metal structure can be first formed as the metal film, and a second portion of the metal structure can be formed by electroplating on top of the metal film. In this way, the metal structure can be adhered to the superconducting material in the superconducting layer, which can provide improved interfacing with the superconducting layer. The metal structure can be formed of any suitable material, such as copper. The metal structure can be, for example, an interconnect pad, a via plate, and/or any other suitable metal structure.

The method can be repeated for any suitable number of layers in the flex circuit board. As one example, the method can additionally include, depositing a second superconducting layer on a second side of the first dielectric layer. For example, the first superconducting layer may be a ground layer and the second superconducting layer may be a signal line layer. The second side of the first dielectric layer can be opposite the first side of the first dielectric layer. The method can additionally include depositing a second metal film on the second superconducting layer. The method can additionally include etching the second metal film to remove a second removed portion of the second metal film and to leave a second remaining portion of the second metal film. The method can additionally include electroplating a second metal structure onto the second remaining portion of the second metal film disposed on the second superconducting layer. The method can additionally include depositing a second dielectric layer on the second superconducting layer. The method can additionally include depositing a third superconducting layer on the second dielectric layer. For example, the third superconducting layer may be a second ground layer. The method can additionally include depositing a third metal film on the third superconducting layer. The method can further include etching the third metal film to remove a third removed portion of the third metal film and to leave a third remaining portion of the third metal film. The method can additionally include electroplating a third metal structure onto the third remaining portion of the third metal film disposed on the third superconducting layer. In this way, the method can provide for a superconducting flex circuit board that includes interconnect pads and/or via plates for each of two ground layers and a signal line layer.

In some embodiments, to provide a metal structure for a via, the method can include etching a via through each of the layers (e.g., the dielectric layers, ground layer(s), and/or signal lines) and depositing the metal film on an inner surface of the via. The metal structure (e.g., via plate) can then be electroplated on the metal film in the inner surface of the via. In this way, the metal film and/or the metal structure can extend through each layer.

In some embodiments, the method can be performed without exposing the flex circuit board to oxygen. For instance, in some embodiments, depositing the first metal film on the superconducting layer is performed without exposure of the superconducting layer to oxygen. As one example, the flex circuit board including the superconducting layer and the dielectric layer can be disposed in a vacuum prior to depositing the first metal film. The vacuum may be maintained until the risk of oxygen contamination is removed, such as until the metal structure is successfully electroplated on.

As used herein, a "flex circuit board" refers to a board including at least one generally planar substrate (e.g., layered substrates) or other support on which the one or more signal lines are formed or otherwise disposed and having flexibility in at least one plane. As used herein, "flexibility" refers to a capability of deforming (e.g., subject to mechanical stress, etc.) without breaking. For example, a rectangular flex circuit board may be flexible along a largest surface of the rectangular flex circuit board. A rectangular flex circuit board may be flexible and/or rigid along at least a portion of its edges. The flexibility may be achieved as a property of material(s) from which the flex circuit board and/or layers of the flex circuit board is/are formed (e.g., metals, such as copper, copper alloys, niobium, aluminum, etc., dielectric materials, nonmetals, polymers, rubbers, etc.), achieved by hinging and/or segmenting of the flex circuit board (e.g., hinging and/or segmenting a rigid portion), and/or any other suitable manner. The substrate(s) may be strictly planar (e.g., having a substantially linear cross-section across a length and width) and/or may be generally planar in that the substrate(s) bend, wrinkle, or are otherwise non-linear in at least one cross-section but generally represent a shape having a depth significantly less than (e.g., less than about 10% of) a length and width.

In some embodiments, the flex circuit board can include at least one ground layer. The ground layer can form an outer surface of the flex circuit board, such as an outer surface along the largest surface. In some embodiments, the flex circuit board can include two ground layers, such as two parallel and spaced apart ground layers. For instance, the two ground layers can form both largest outer surfaces of the flex circuit board. A ground layer can act as an electrical isolation layer to isolate signal lines on one side of the ground layer from interfering signals (e.g., from signal lines on other layers, other boards, the environment, etc.) on another side of the ground layer. For instance, the ground layer can be coupled to earth ground and/or other suitable ground(s).

The ground layer(s) can be or can include any suitable electrically conductive material. In some embodiments, the ground layer(s) can be or can include superconducting ground layer(s) including superconducting material(s), such as superconducting material(s) that achieve(s) superconductivity at a temperature below about 3 kelvin, such as about 1 kelvin, such as about 20 millikelvin. As examples, the ground layer(s) can be or can include niobium, tin, aluminum, molybdenum disulfide, BSCCO, and/or other suitable superconducting materials. Additionally and/or alternatively, the ground layer(s) can be or can include material having high signal transfer performance characteristics, such as low resistance, low reflectivity, low distortion, etc. such that a signal is substantially unchanged by passing through the signal line. As examples, the ground layer(s) can be or can include copper, gold, and/or other suitable materials having high signal transfer performance characteristics. Additionally and/or alternatively, the ground layer(s) can be or can include material(s) having desirable thermal characteristics, such as suitably high and/or low thermal transfer, such as, for example, copper, copper alloy, etc.

In some embodiments, the flex circuit board can include at least one dielectric layer. The dielectric layer(s) can be or can include any suitable dielectric material, such as dielectric polymers. In some embodiments, the dielectric layer(s) can be or can include flexible dielectric material. As one example, the dielectric layer(s) can be or can include polyimide. At least a portion of the dielectric layer(s) can be formed on or otherwise disposed proximate to at least a portion of an inner surface of the ground layer(s). For example, in some embodiments, an inner surface of a ground layer can be mated with an outer surface of a dielectric layer. Furthermore, in some embodiments, inner surfaces of two dielectric layers can be mated with signal lines disposed therebetween.

The flex circuit board can include one or more signal lines. The one or more signal lines can be disposed on a surface (e.g., an inner surface) of at least one dielectric layer. As an example, in some implementations, the one or more signal lines can be disposed between opposing inner surfaces of two dielectric layers. The signal line(s) can be or can include any suitable electrically conductive material. In some embodiments, the signal line(s) can be or can include superconducting signal line(s) including superconducting material(s), such as superconducting material(s) that achieve(s) superconductivity at a temperature below about 3 kelvin, such as about 1 kelvin, such as about 20 millikelvin. As examples, the signal line(s) can be or can include niobium, tin, aluminum, molybdenum disulfide, BSCCO, and/or other suitable superconducting materials. Additionally and/or alternatively, the signal line(s) can be or can include material having high signal transfer performance characteristics. As examples, the signal line(s) can be or can include copper, gold, and/or other suitable materials having high signal transfer performance characteristics. Additionally and/or alternatively, the signal line(s) can be or can include material(s) having desirable thermal characteristics, such as, for example, copper, copper alloy, etc.

In some embodiments, the flex circuit board can include one or more vias. For instance, the vias can extend through the ground layer(s), the dielectric layer(s), and/or the signal line(s). The vias can serve to improve isolation of the signal lines. In some embodiments, the via(s) can be plated with via plate(s) that extend along the via(s). In some embodiments, the via plate(s) can be or can include conductive material, such as copper.

Systems and methods according to example aspects of the present disclosure can provide for a number of technical effects and benefits. For example, systems and methods according to example aspects of the present disclosure can provide for metal structures to be formed on superconducting materials of flex circuit boards to provide improved interfacing with the superconducting materials. The metal structures can be useful for interfacing with the superconducting materials. This can provide for, for example, improved signal transmit characteristics in a quantum computing system.

As used herein, the use of the term "about" or "approximately" in conjunction with a stated numerical value is intended to refer to within 10% of the stated numerical value.

With reference now to the FIGS., example embodiments of the present disclosure will be discussed in further detail.

FIG. 1 depicts an example quantum computing system 100. The example system 100 is an example of a system implemented as a classical or quantum computer program on one or more classical computers or quantum computing devices in one or more locations, in which the systems, components, and techniques described below can be implemented. FIG. 1 depicts an example quantum computing system that can be used to implement aspects of the present disclosure. Those of ordinary skill in the art, using the disclosures provided herein, will understand that other quantum computing structures or systems can be used without deviating from the scope of the present disclosure.

The system 100 includes quantum hardware 102 in data communication with one or more classical processor(s) 104. For instance, quantum hardware 102 can represent and/or manipulate information using qubits. A qubit can be or include any suitable quantum device that enables the superposition of multiple states, e.g., data in both the "0" and "1" state. As one example, a qubit can be or include a unit of superconducting material, such as superconducting material that achieves superconductivity at a temperature below about 3 kelvin, such as about 1 kelvin, such as 20 mK.

The quantum hardware 102 can include components for performing quantum computation. For example, the quantum hardware 102 can include a quantum system 110, control device(s) 112, and readout device(s) 114 (e.g., readout resonator(s)). The quantum system 110 can include one or more multi-level quantum subsystems, such as a register of qubits. In some implementations, the multi-level quantum subsystems can include superconducting qubits, such as flux qubits, charge qubits, transmon qubits, gmon qubits, etc.

The classical processor(s) 104 can be binary processors, such as processors that operate on data represented as a plurality of bits. As one example, bits can be represented by a voltage differential between a low voltage (e.g., 0V) and a high voltage (e.g., 5V) at a point of reference, such as a memory cell, circuit node, etc. The low voltage can be associated with a "0" state and the high voltage can be associated with a "1" state. The classical processor(s) 104 can be configured to, in addition to any other suitable function(s) of the classical processor(s) 104, control the quantum hardware 102. For instance, the classical processor(s) 104 can be coupled to the quantum hardware 102 (e.g., by signal lines) and/or configured to send control signals to perform quantum operations using the quantum hardware 102. As one example, the classical processor(s) 104 can be configured to send control signals that implement quantum gate operations at the quantum hardware 102 (e.g., by control device(s) 112). Additionally and/or alternatively, the classical processor(s) 104 can be configured to send control signals that cause the quantum hardware 102 to perform quantum state measurements and/or provide the quantum state measurements to the classical processor(s) 104 (e.g., by readout device(s) 114). For example, the classical processor(s) 104 can receive measurements of the quantum system 110 that can be interpretable by the classical processor(s) 104.

The type of multi-level quantum subsystems that the system 100 utilizes may vary. For example, in some cases it may be convenient to include one or more readout device(s) 114 attached to one or more superconducting qubits, e.g., transmon, flux, gmon, xmon, or other qubits.

Quantum circuits may be constructed and applied to the register of qubits included in the quantum system 110 via multiple signal lines (e.g., signal lines 120 of FIG. 2) that are coupled to one or more control devices 112. Example control devices 112 that operate on the register of qubits can be used to implement quantum logic gates or circuits of quantum logic gates, e.g., Hadamard gates, controlled-NOT (CNOT) gates, controlled-phase gates, T gates, multi-qubit quantum gates, coupler quantum gates, etc. The one or more control devices 112 may be configured to operate on the quantum system 110 through one or more respective control parameters (e.g., one or more physical control parameters). For example, in some implementations, the multi-level quantum subsystems may be superconducting qubits and the control devices 112 may be configured to provide control pulses to control lines (e.g., signal lines 120 of FIG. 2) to generate magnetic fields to adjust a frequency of the qubits.

The quantum hardware 102 may further include readout devices 114 (e.g., readout resonators). Measurement results 108 obtained via measurement devices may be provided to the classical processors 104 for processing and analyzing. In some implementations, the quantum hardware 102 may include a quantum circuit and the control device(s) 112 and readout devices(s) 114 may implement one or more quantum logic gates that operate on the quantum system 110 through physical control parameters (e.g., microwave pulse) that are sent through wires included in the quantum hardware 102. Further examples of control devices include arbitrary waveform generators, wherein a DAC creates the signal.

The readout device(s) 114 may be configured to perform quantum measurements on the quantum system 110 and send (e.g., by signal lines 120 of FIG. 2) measurement results 108 to the classical processors 104. In addition, the quantum hardware 102 may be configured to receive data (e.g., by signal lines 120 of FIG. 2) specifying physical control parameter values 106 from the classical processors 104. The quantum hardware 102 may use the received physical control parameter values 106 to update the action of the control device(s) 112 and readout devices(s) 114 on the quantum system 110. For example, the quantum hardware 102 may receive data specifying new values representing voltage strengths of one or more DACs included in the control devices 112 and may update the action of the DACs on the quantum system 110 accordingly. The classical processors 104 may be configured to initialize the quantum system 110 in an initial quantum state, e.g., by sending data to the quantum hardware 102 specifying an initial set of parameters 106.

The readout device(s) 114 can take advantage of a difference in the impedance for the |0⟩ and |1⟩ states of an element of the quantum system, such as a qubit, to measure the state of the element (e.g., the qubit). For example, the resonance frequency of a readout resonator can take on different values when a qubit is in the state |0⟩ or the state |1⟩, due to the nonlinearity of the qubit. Therefore, a microwave pulse reflected from the readout device 114 carries an amplitude and phase shift that depend on the qubit state. In some implementations, a Purcell filter can be used in conjunction with the readout device(s) 114 to impede microwave propagation at the qubit frequency.

The system 100 includes control device(s) 112. Control device(s) 112 can operate the quantum hardware 102. For example, control device(s) 112 can include a waveform generator configured to generate control pulses according to example aspects of the present disclosure.

In some implementations, the control device(s) 112 may include a data processing apparatus and associated memory. The memory may include a computer program having instructions that, when executed by the data processing apparatus, cause the data processing apparatus to perform one or more functions described herein, such as applying a control signal to a qubit and/or to a tunable coupler.

Figure 2:
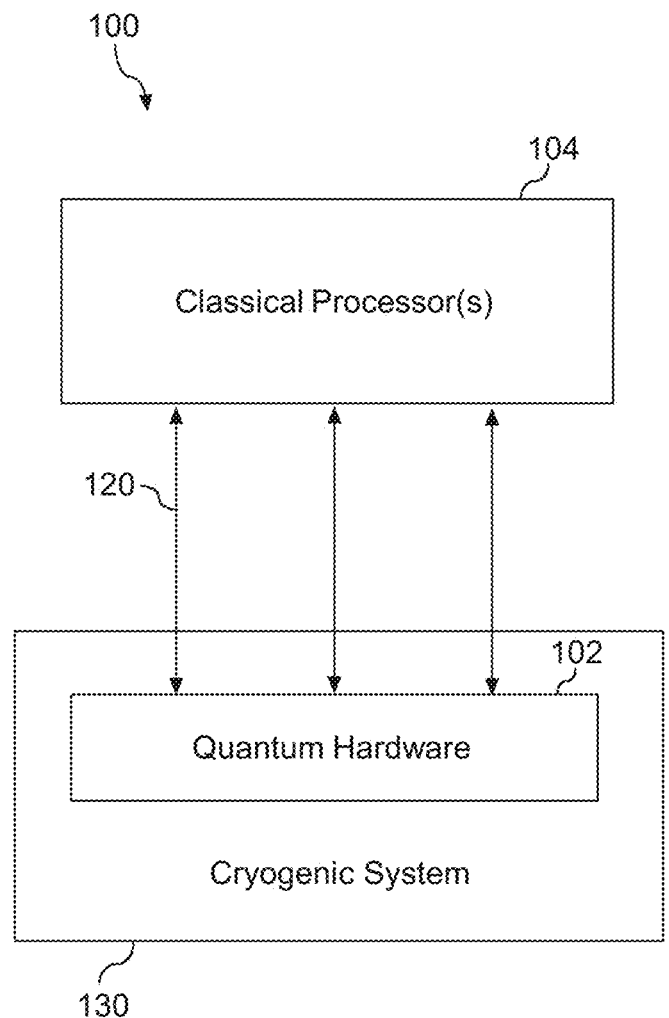
FIG. 2 depicts an example quantum computing system according to example embodiments of the present disclosure.

FIG. 2 depicts an example quantum computing system 100 according to example embodiments of the present disclosure. As illustrated in FIG. 2, quantum hardware 102, such as, but not limited to, quantum system 110, control device(s) 112, readout device(s) 114, and/or any other suitable components of quantum hardware 102 discussed with regard to FIG. 1, can be located within cryogenic cooling system 130. Additionally and/or alternatively, classical processor(s) 104 can be located outside cryogenic cooling system 130. Cryogenic cooling system 130 can be or can be located in a vacuum chamber. For example, the quantum hardware 102 and/or signal line(s) 120 (e.g., flex circuit boards) can be supported by a chamber mount that is configured to be inserted into a vacuum cannister to form a vacuum chamber. For instance, the chamber mount can be configured to dispose the quantum hardware 102 in a vacuum (e.g., formed by the vacuum chamber). The cryogenic cooling system 130 configured to provide a temperature gradient (e.g., a plurality of cooling stages) within the vacuum chamber. For example, a temperature gradient can be formed by a plurality of cryogenic cooling stages, such as stages of a dilution refrigerator. Example stages of a dilution refrigerator can be or can include, for example, a first intermediate clamp stage, a first stage pulse tube stage, a second intermediate clamp stage, a second stage pulse tube stage, a still stage, an intermediate heat exchanger stage, a mixing chamber stage, a Joule-Thompson cooling stage, a helium liquefier stage, and/or any other suitable stages of a dilution refrigerator.

Cryogenic cooling system 130 can be configured to cool quantum hardware 102. Additionally and/or alternatively, classical processor(s) 104 are not cooled by cryogenic cooling system 130. For instance, classical processor(s) 104 can operate at a temperature around room temperature (e.g., around 300 kelvin) and/or a temperature around about 100 kelvin, whereas quantum hardware 102 can operate at a temperature around about absolute zero (e.g., less than about 1 kelvin) which can thus require cooling by cryogenic cooling system 130 to effectively operate.

Quantum computing system 100 can include signal line(s) 120. The signal line(s) 120 can couple classical processor(s) 104 to quantum hardware 102. For instance, as classical processor(s) 104 and quantum hardware 102 can be in signal communication, such as to transmit parameter(s) 106 and/or measurement result(s) 108 of FIG. 1 in addition to any other suitable signals, the classical processor(s) 104 can be coupled to quantum hardware 102 by signal lines 120. For instance, according to example aspects of the present disclosure, signal lines 120 can be or can include one or more flex circuit boards, such as superconducting flex circuit boards, that is/are configured to couple quantum hardware 102 and classical processor(s) 104. Generally, signal lines 120 include physical connections to allow for faster and/or more robust communication between quantum hardware 102 and classical processor(s) 104. As illustrated in FIG. 2, signal lines 120 can be at least partially located in cryogenic cooling system 130 to provide coupling to quantum hardware 102. Increasing density of signal lines 120 (e.g., associated with increasing complexity of quantum hardware 102) can present challenges in operating quantum computing system 100, which can be mitigated by the inclusion of flex circuit boards according to example aspects of the present disclosure.

Figure 3:
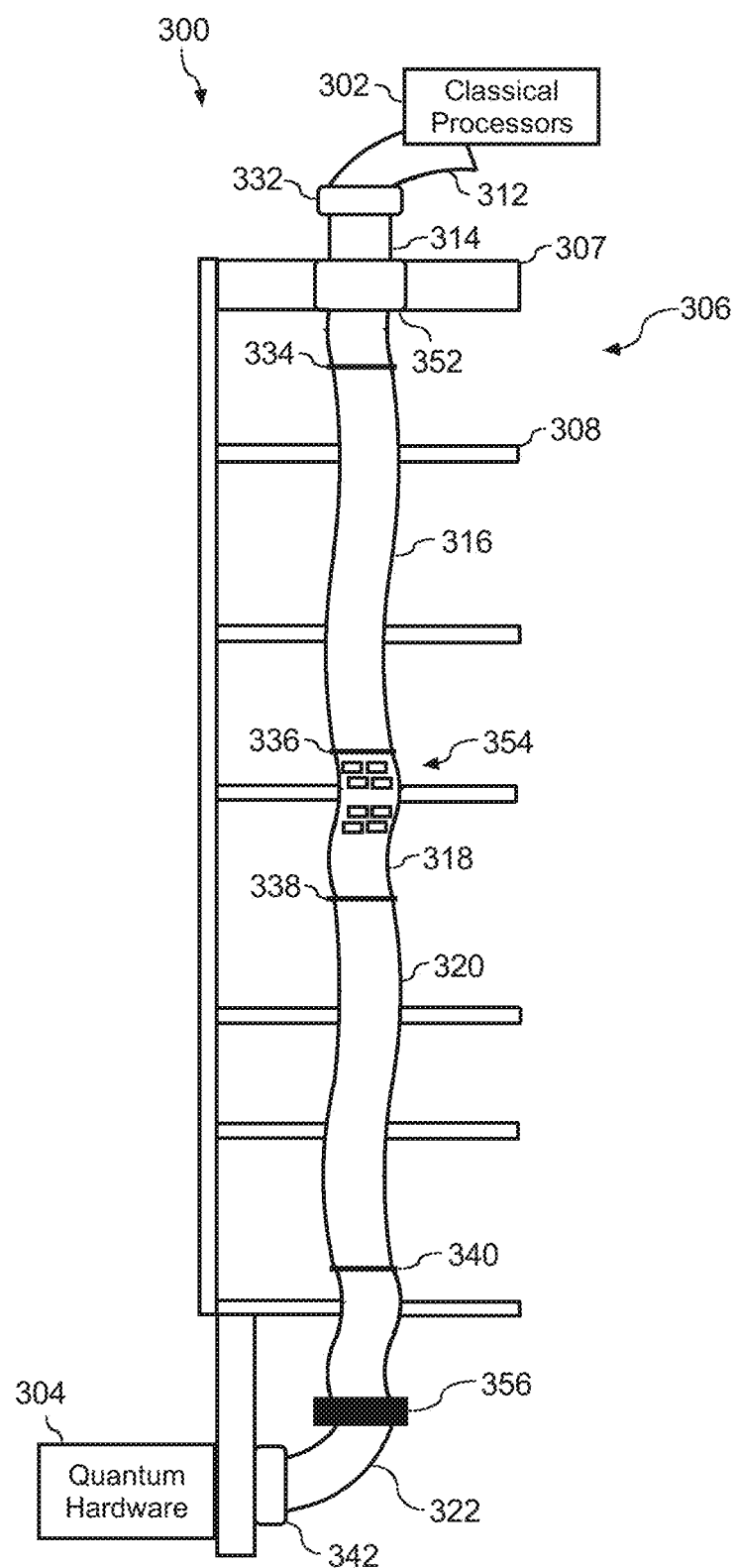
FIG. 3 depicts an example quantum computing system according to example embodiments of the present disclosure.

FIG. 3 depicts an example quantum computing system 300 according to example embodiments of the present disclosure. The quantum computing system 300 can include one or more classical processors 302 and quantum hardware 304 including one or more qubits. The quantum computing system 300 can include a chamber mount 308 configured to support the quantum hardware 304 and a vacuum chamber configured to receive the chamber mount 308 and dispose the quantum hardware 304 in a vacuum. The vacuum chamber can form a cooling gradient from an end of the vacuum chamber (e.g., cap 307) to the quantum hardware 304. For example, the vacuum chamber can form a cooling gradient from a first temperature, such as room temperature (e.g., about 300 kelvin) to a second temperature, such as at or about absolute zero (e.g., about 10 millikelvin), such as to provide a temperature at the quantum hardware 304 at which the qubits experience superconductivity. In some embodiments, the cooling gradient can be formed by a plurality of cooling stages having progressively increasing and/or decreasing temperatures. As one example, the cooling stages can be stages of a staged cryogenic cooling system, such as a dilution refrigerator.

Figure 4:
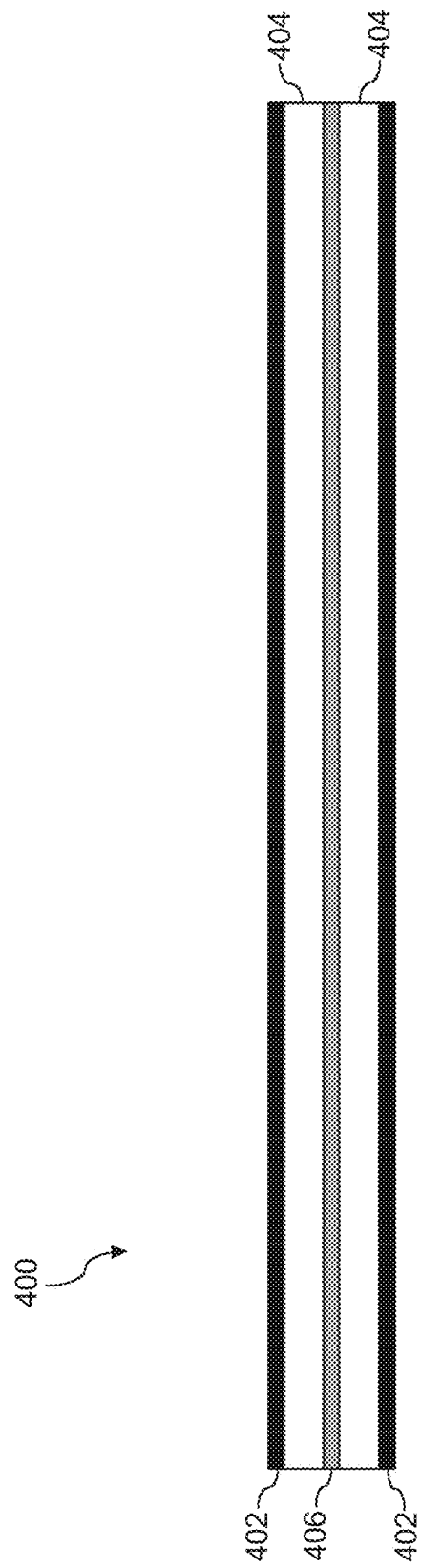
FIG. 4 depicts a cross-sectional view of an example flex circuit board according to example embodiments of the present disclosure.
Figure 5:
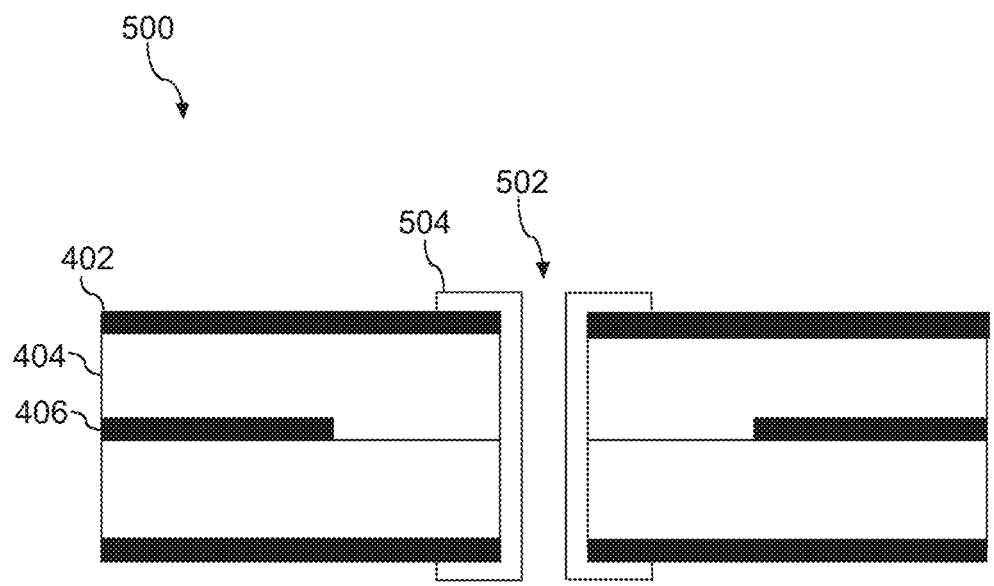
FIG. 5 depicts a cross-sectional view of an example flex circuit board according to example embodiments of the present disclosure.
Figure 6:
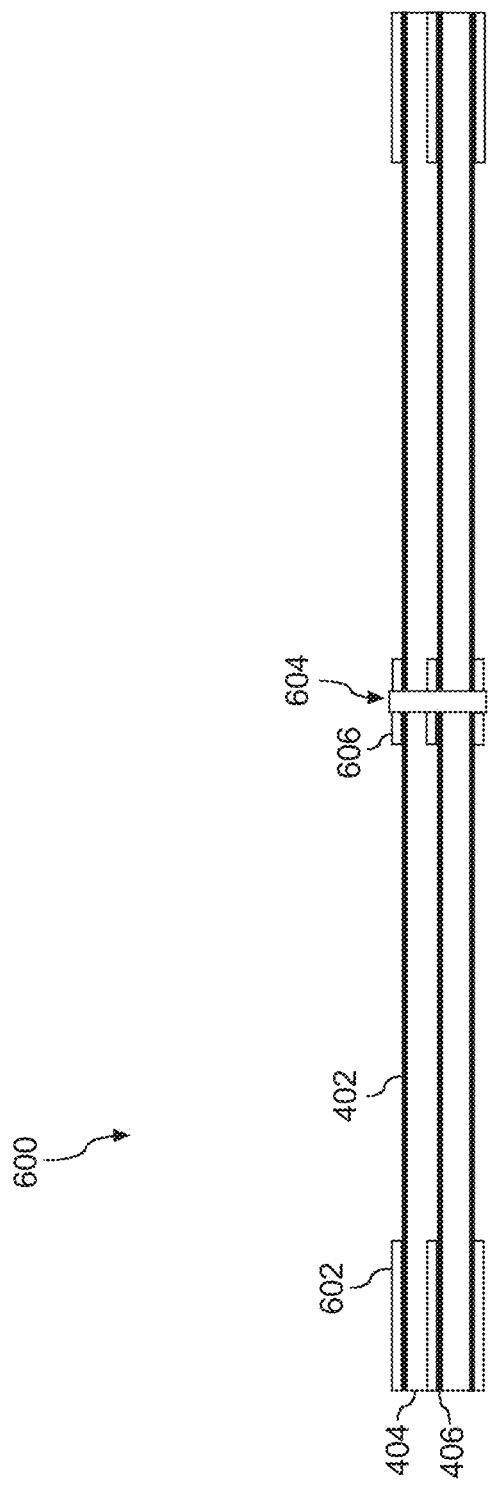
FIG. 6 depicts a cross-sectional view of an example flex circuit board according to example embodiments of the present disclosure.

The quantum computing system 300 can include one or more signal lines between the classical processor(s) 302 and quantum hardware 304. According to example aspects of the present disclosure, the quantum computing system 300 can include one or more flex circuit boards 306 including one or more signal lines. The flex circuit board(s) 306 can be configured to transmit signals by the one or more signal lines through the vacuum chamber to couple the one or more classical processors 302 to the quantum hardware 304. The flex circuit board(s) 306 can include a plurality of signal lines and can provide a significantly improved signal line density, in addition to providing improved isolation, reduced thermal conductivity, and/or improved scalability. For instance, including flex circuit boards 306 according to example aspects of the present disclosure to couple the classical processors 302 to the quantum hardware 304 can provide for infrastructure that reliably scales to the increasingly greater numbers of qubits that are achieved and/or expected in contemporary and/or future quantum computing systems. Example flex circuit boards that may be employed in accordance with example aspects of the present disclosure are illustrated in FIGS. 4-6

In some embodiments, some or all of the flex circuit board(s) 306 can include at least one ground layer. The ground layer can form an outer surface of the flex circuit board 306, such as an outer surface along the largest surface. In some embodiments, the flex circuit board 306 can include two ground layers, such as two parallel and spaced apart ground layers. For instance, the two ground layers can form both largest outer surfaces of the flex circuit board 306. A ground layer can act as an electrical isolation layer to isolate signal lines on one side of the ground layer from interfering signals (e.g., from signal lines on other layers, other boards, the environment, etc.) on another side of the ground layer. For instance, the ground layer can be coupled to earth ground and/or other suitable ground(s).

The ground layer(s) can be or can include any suitable electrically conductive material. In some embodiments, the ground layer(s) can be or can include superconducting ground layer(s) including superconducting material(s), such as superconducting material(s) that achieve(s) superconductivity at a temperature below about 3 kelvin, such as about 1 kelvin, such as about 20 millikelvin. As examples, the ground layer(s) can be or can include niobium, tin, aluminum, molybdenum disulfide, BSCCO, and/or other suitable superconducting materials. Additionally and/or alternatively, the ground layer(s) can be or can include material having high signal transfer performance characteristics, such as low resistance, low reflectivity, low distortion, etc. such that a signal is substantially unchanged by passing through the signal line. As examples, the ground layer(s) can be or can include copper, gold, and/or other suitable materials having high signal transfer performance characteristics. Additionally and/or alternatively, the ground layer(s) can be or can include material(s) having desirable thermal characteristics, such as suitably high and/or low thermal transfer, such as, for example, copper, copper alloy, etc.

In some embodiments, the flex circuit board 306 can include at least one dielectric layer. The dielectric layer(s) can be or can include any suitable dielectric material, such as dielectric polymers. In some embodiments, the dielectric layer(s) can be or can include flexible dielectric material. As one example, the dielectric layer(s) can be or can include polyimide. At least a portion of the dielectric layer(s) can be formed on or otherwise disposed proximate to at least a portion of an inner surface of the ground layer(s). For example, in some embodiments, an inner surface of a ground layer can be mated with an outer surface of a dielectric layer. Furthermore, in some embodiments, inner surfaces of two dielectric layers can be mated with signal lines disposed therebetween.

The flex circuit board 306 can include one or more signal lines. The one or more signal lines can be disposed on a surface (e.g., an inner surface) of at least one dielectric layer. As an example, in some implementations, the one or more signal lines can be disposed between opposing inner surfaces of two dielectric layers. The signal line(s) can be or can include any suitable electrically conductive material. In some embodiments, the signal line(s) can be or can include superconducting signal line(s) including superconducting material(s), such as superconducting material(s) that achieve(s) superconductivity at a temperature below about 3 kelvin, such as about 1 kelvin, such as about 20 millikelvin.

As examples, the signal line(s) can be or can include niobium, tin, aluminum, molybdenum disulfide, BSCCO, and/or other suitable superconducting materials. Additionally and/or alternatively, the signal line(s) can be or can include material having high signal transfer performance characteristics. As examples, the signal line(s) can be or can include copper, gold, and/or other suitable materials having high signal transfer performance characteristics. Additionally and/or alternatively, the signal line(s) can be or can include material(s) having desirable thermal characteristics, such as, for example, copper, copper alloy, etc.

In some embodiments, the flex circuit board 306 can include one or more vias. For instance, the vias can extend through the ground layer(s), the dielectric layer(s), and/or the signal line(s). The vias can serve to improve isolation of the signal lines. In some embodiments, the via(s) can be plated with via plate(s) that extend along the via(s). In some embodiments, the via plate(s) can be or can include conductive material, such as copper.

For instance, in some embodiments, a quantum computing system 300 can include quantum hardware 304 in data communication with one or more classical processor(s) 302. For instance, quantum hardware 304 can represent and/or manipulate information using qubits. A qubit can be or include any suitable quantum device that enables the superposition of multiple states, e.g., both the "0" and "1" state. As one example, a qubit can be or include a unit of superconducting material, such as superconducting material that achieves superconductivity at a temperature below about 3 kelvin, such as about 1 kelvin, such as about 20 millikelvin. In some embodiments, the quantum computing system 300 can include one or more multi-level quantum subsystems, such as a register of qubits. In some implementations, the multi-level quantum subsystems can include superconducting qubits, such as flux qubits, charge qubits, transmon qubits, gmon qubits, etc.

The classical processor(s) 302 can be binary processors, such as processors that operate on data represented as a plurality of bits. As one example, bits can be represented by a voltage differential between a low voltage (e.g., 0V) and a high voltage (e.g., 5V) at a point of reference, such as a memory cell, circuit node, etc. The low voltage can be associated with a "0" state and the high voltage can be associated with a "1" state. The classical processor(s) 302 can be configured to, in addition to any other suitable function(s) of the classical processor(s) 302, control the quantum hardware 304. For instance, the classical processor(s) 302 can be coupled to the quantum hardware 304 (e.g., by signal lines included in flex circuit boards 306 according to example aspects of the present disclosure) and/or configured to send control signals to perform quantum operations using the quantum hardware 304. As one example, the classical processor(s) 302 can be configured to send control signals that implement quantum gate operations at the quantum hardware 304 (e.g., by control device(s)). Additionally and/or alternatively, the classical processor(s) 302 can be configured to send control signals that cause the quantum hardware 304 to perform quantum state measurements and/or provide the quantum state measurements to the classical processor(s) 302 (e.g., by readout device(s)). For example, the classical processor(s) 302 can receive measurements of the quantum system that can be interpretable by the classical processor(s) 302.

According to example aspects of the present disclosure, the quantum computing system 300 can include one or more flex circuit boards 306 including one or more signal lines. The classical processor(s) 302 can be coupled to at least one first flex circuit board. For instance, the classical processor(s) 302 can be coupled to the first flex circuit board(s) 314 by a classical-flex interconnect 332. The classical-flex interconnect 332 can convert from a classical signal transmission medium (e.g., a coaxial cable) 312 to the first flex circuit board(s) 314.

As one example, the classical-flex interconnect 332 can be or can include a compression interposer. The compression interposer can include an array (e.g., a two-dimensional array) of spring pads. A connector receiving signals from the classical processor(s) 302, such as via one or more coaxial cables 312 (e.g., one coaxial cable 312 per signal line) can be compressed against the compression interposer to form signal communications between the spring pads and the connector (e.g., the coaxial cables). The spring pads can each be coupled to a signal line on the first flex circuit board 314 such that signals can be transmitted from the classical processor(s) 302 (e.g., the coaxial cables) to the signal lines. The compression interposer can provide for connecting signal transmission media 312 having a relatively lower spatial density, such as coaxial cables, which may occupy a relatively larger amount of space per cable, to signal transmission media having a relatively higher spatial density, such as signal lines embedded in a first flex circuit board 314 provided according to example aspects of the present disclosure. Additionally, the compression interposer can achieve high isolation between signal lines and/or low reflectivity along a signal line that is/are suitable for quantum computing applications.

In some embodiments, the first flex circuit board(s) 314 can be or can include a first flex circuit board material at the ground layer(s) and/or the signal line(s). The first flex circuit board material can be selected to provide high signal transfer performance characteristics. As examples, the first flex circuit board material can be or can include copper, brass, gold, and/or other suitable materials having high signal transfer performance characteristics. For instance, the first flex circuit board(s) 314 can include copper signal lines and/or ground layer(s) to provide high signal transfer performance characteristics.

The first flex circuit board(s) 314 can pass through a hermetic seal 352 positioned at an end (e.g., an entrance) of the vacuum chamber, such as cap 307. For example, a flex circuit board (e.g., first flex circuit board 314) can be configured to pass through the hermetic seal 352 such that a first portion of the flex circuit board (e.g., first flex circuit board 314) is disposed in the vacuum chamber and a second portion of the flex circuit board (e.g., first flex circuit board 314) is disposed outside of the vacuum chamber while the hermetic seal 352 forms a vacuum seal for the vacuum chamber. The hermetic seal 352 can provide for the first flex circuit board(s) 314 to enter the vacuum chamber without (e.g., substantially) destroying a vacuum created by the vacuum chamber. As one example, the hermetic seal 352 can include a fitted seal for each first flex circuit board 314. The fitted seal(s) can receive the first flex circuit board(s) 314 and form a vacuum seal with surface(s) of the first flex circuit board(s) 314. Additionally, the hermetic seal 352 can include one or more seal slots configured to receive the fitted seal(s) and/or the first flex circuit board(s) 314. For example, the fitted seal(s) can form a vacuum seal with the seal slot(s) while allowing the first flex circuit board(s) 314 to pass through the seal slot(s) and into the vacuum chamber. In this way, the flex circuit board(s) 306 can enter the vacuum chamber without experiencing signal disruptions from breaks in the circuit boards, as the boards can continuously pass into the vacuum chamber. In some embodiments, the hermetic seal 352 can include fastening systems to secure the fitted seals to the seal slots and/or form a vacuum seal, such as, for example, screws, bolts, seal rings, O rings, etc. In some embodiments, the hermetic seal 352 can form a vacuum seal without requiring adhesive material (e.g., glue, resin, etc.) such that, for example, residual adhesive material does not contaminate the flex circuit boards 306.

The first flex circuit board(s) 314 can be coupled to at least one second flex circuit board(s) 316. The first flex circuit board(s) 314 can be coupled to the second flex circuit board(s) 316 by at least one flex-flex interconnect 334. For instance, the flex-flex interconnect(s) 334 can couple (structurally and/or electrically) the ground layer(s), dielectric layer(s), and/or signal line(s) of a first flex circuit board 314 to a second flex circuit board 316. As examples, the flex-flex interconnect(s) 334 can be formed by soldering, welding, and/or otherwise fusing components of a first flex circuit board 314 to a second flex circuit board 316. The flex-flex interconnect(s) 334 can be or can include any suitable interconnection of two flex circuit board(s) 306 such as, for example, a butt joint, an overlap joint, and/or any other suitable interconnection(s).

The second flex circuit board(s) 316 can have at least a different material composition from the first flex circuit board(s) 314. In some embodiments, the second flex circuit board(s) 316 can be or can include a second flex circuit board material at the ground layer(s) and/or the signal line(s). The second flex circuit board material can be selected to provide high signal transfer performance characteristics and/or reduced thermal conductivity. As examples, the second flex circuit board material can be or can include a copper alloy and/or other suitable materials having desirable thermal characteristics. For instance, the second flex circuit board(s) 316 can include copper alloy signal lines and/or ground layer(s) to provide reduced thermal conductivity from the upper portions of the vacuum chamber (e.g., first circuit boards 314) and/or dispelling heat produced at subsequent components, such as surface mount attenuators 354.

In some embodiments, the second flex circuit board(s) 316 can be coupled to at least one surface mount attenuator board 318. For instance, the second flex circuit board(s) 316 can be coupled to the surface mount attenuator board(s) 318 by at least one flex-flex interconnect 336. For instance, the flex-flex interconnect(s) 336 can couple (structurally and/or electrically) the ground layer(s), dielectric layer(s), and/or signal line(s) of a second flex circuit board 316 to a surface mount attenuator board 318. As examples, the flex-flex interconnect(s) 336 can be formed by soldering, welding, and/or otherwise fusing components of a second flex circuit board 316 to a surface mount attenuator board 318. The flex-flex interconnect(s) 336 can be or can include any suitable interconnection of two flex circuit board(s) 306 such as, for example, a butt joint, an overlap joint, and/or any other suitable interconnection(s).

The surface mount attenuator board 318 can be a flexible printed circuit board. In some embodiments, the surface mount attenuator board(s) 318 can be or can include a surface mount attenuator board material at the ground layer(s) and/or the signal line(s). The surface mount attenuator board material can be selected to provide high signal transfer performance characteristics. As examples, the surface mount attenuator board material can be or can include copper, brass, gold, and/or other suitable materials having high signal transfer performance characteristics. For instance, the surface mount attenuator board can include copper signal lines and/or ground layer(s) to provide high signal transfer performance characteristics.

The surface mount attenuator board(s) 318 can include one or more surface mount attenuators 354. The surface mount attenuator(s) 354 can be configured to attenuate or block thermal photon interference. In some embodiments, the surface mount attenuator board(s) 318 and/or the surface mount attenuator(s) 354 can be placed at a temperature cold enough such that the surface mount attenuator(s) 354 do not produce thermal photons. In some embodiments, the surface mount attenuator(s) 354 can be disposed in an isolation plate. The isolation plate can be configured to isolate the one or more surface mount attenuators. The isolation plate can be attached to the surface mount attenuator board(s) 318. In some embodiments, the isolate plate can be mounted to a ground layer and/or grounded. The isolation plate can include one or more cavities configured to isolate a first surface mount attenuator from a second surface mount attenuator. For example, the cavities can surround the first surface mount attenuator in a direction of a second surface mount attenuator and block cross-talk between attenuators.

The quantum computing system 300 can include at least one third flex circuit board 320. For instance, the surface mount attenuator board(s) 318 can be coupled to the third flex circuit board(s) 320 by at least one flex-flex interconnect 338. For instance, the flex-flex interconnect(s) 338 can couple (structurally and/or electrically) the ground layer(s), dielectric layer(s), and/or signal line(s) of a surface mount attenuator board 318 to a third flex circuit board 320. As examples, the flex-flex interconnect(s) 338 can be formed by soldering, welding, and/or otherwise fusing components of a surface mount attenuator board 318 to a third flex circuit board 320. The flex-flex interconnect(s) 338 can be or can include any suitable interconnection of two flex circuit board(s) 306 such as, for example, a butt joint, an overlap joint, and/or any other suitable interconnection(s).

The third flex circuit board(s) 320 can be positioned at a point in the vacuum chamber at which the cooling gradient is cool enough such that some materials exhibit superconductivity. For example, at least a portion of the third flex circuit board(s) 320 can have a temperature of less than about three kelvin.

In some embodiments, the third flex circuit board(s) 320 can be or can include a third flex circuit board material at the ground layer(s) and/or the signal line(s). The third flex circuit board(s) 320 material can be selected to be superconducting at a temperature which at least a portion of the third flex circuit board(s) 320 experiences superconductivity. As examples, the third flex circuit board(s) 320 material can be or can include niobium, tin, aluminum, and/or other suitable superconducting materials. For instance, the third flex circuit board(s) 320 can include copper-plated niobium signal lines and/or ground layer(s) to provide superconductivity. For instance, the copper plating on the copper-plated niobium board(s) can be useful in interfacing with the superconducting niobium, which can provide for improved signal transfer characteristics. In some embodiments, the copper-plated niobium board(s) can be formed by first applying a layer of niobium, followed by an adhesion layer (e.g., a thin copper layer) to prevent the formation of oxides, then a thicker layer of copper.

In some embodiments, the third flex circuit board(s) 320 can be coupled to at least one fourth flex circuit board 322. The third flex circuit board(s) 320 can be coupled to the fourth flex circuit board(s) 322 by at least one flex-flex interconnect 340. For instance, the flex-flex interconnect(s) 340 can couple (structurally and/or electrically) the ground layer(s), dielectric layer(s), and/or signal line(s) of a third flex circuit board 320 to a fourth flex circuit board 322. As examples, the flex-flex interconnect(s) 340 can be formed by soldering, welding, and/or otherwise fusing components of a third flex circuit board 320 to a fourth flex circuit board 322. The flex-flex interconnect(s) 340 can be or can include any suitable interconnection of two flex circuit board(s) 306 such as, for example, a butt joint, an overlap joint, and/or any other suitable interconnection(s).

The fourth flex circuit board(s) 322 can couple the third flex circuit board(s) 320 to the quantum hardware 304. For example, a connector 342 at an end of the fourth flex circuit board(s) 322 can attach to a port that is in signal communication with the quantum hardware 304. As one example, the connector can be a T-joint connector, such as a T-joint connector including superconducting materials (e.g., tin). Additionally and/or alternatively, the connector 342 may be a planar spring array.

In some embodiments, the fourth flex circuit board(s) 322 can be or can include a fourth flex circuit board material at the ground layer(s) and/or the signal line(s). The fourth flex circuit board(s) 322 material can be selected to provide high signal transfer performance characteristics. As examples, the fourth flex circuit board(s) 322 material can be or can include copper, brass, gold, and/or other suitable materials having high signal transfer performance characteristics. For instance, the fourth flex circuit board(s) 322 can include copper signal lines and/or ground layer(s) to provide high signal transfer performance characteristics. Additionally and/or alternatively, the fourth flex circuit board(s) 322 material can be selected to be superconducting at a temperature at which at least a portion of the fourth flex circuit board(s) 322 operate. As examples, the fourth flex circuit board(s) 322 material can be or can include niobium, tin, aluminum, molybdenum disulfide, BSCCO, and/or other suitable superconducting materials.

In some embodiments, the fourth flex circuit board(s) 322 can be or can include a filter 356, such as an XYZ and/or IR filter 356. For instance, the filter 356 can be configured to reduce effects of noise, thermal photons, and/or other potential sources of interference. As one example, the filter 356 can include a cavity in the fourth flex circuit board(s) 322 that is filled with a filter material, such as a particulate suspension, to provide XYZ/IR filtering. In some examples, the filter material can provide less attenuation to signals of a first frequency and greater attenuation to signals of a second, higher frequency. For instance, some filter materials provide attenuation that increases in a substantially monotonic fashion with increasing signal frequency for at least a portion of a targeted frequency band. In some embodiments, aspects of the filter material can be configured for lowpass and/or bandpass operation.

In some embodiments, the filter 356 can be bounded by one or more boundaries of a cavity within the fourth flex circuit board(s) 322 (e.g., a cavity within the dielectric material). For instance, a cavity within the fourth flex circuit board(s) 322 can be filled with a filter material (e.g., a magnetically loaded polymer). In some embodiments, the cavity can be filled (e.g., partially or completely) with filter material via an access within the fourth flex circuit board(s) 322 when the filter material is in any pourable, injectable, and/or moldable state (e.g., flowing particulates, soft/plasticized materials, gels, slurries, pastes, foams, uncured thermosets, softened/melted thermoplastics, etc.). In some embodiments, the cavity can be filled with the filter material in a substantially solid state (e.g., by press-fitting into the cavity, etc.).

FIG. 4 depicts a cross-sectional view of an example flex circuit board 400 according to example embodiments of the present disclosure. The flex circuit board 400 can include one or more signal lines 406. The flex circuit board 400 can be configured to transmit signals by the one or more signal lines 406, such as through a vacuum chamber to couple one or more classical processors to quantum hardware. The flex circuit board 400 can include a plurality of signal lines 406 and can provide a significantly improved signal line density, in addition to providing improved isolation, reduced thermal conductivity, and/or improved scalability. For instance, including flex circuit board(s) 400 according to example aspects of the present disclosure to couple classical processors to quantum hardware can provide for infrastructure that reliably scales to the increasingly greater numbers of qubits that are achieved and/or expected in contemporary and/or future quantum computing systems.

As used herein, a "flex circuit board" refers to a board including at least one generally planar substrate (e.g., layered substrates) or other support on which the one or more signal lines 406 are formed or otherwise disposed and having flexibility in at least one plane. As used herein, "flexibility" refers to a capability of deforming (e.g., subject to mechanical stress, etc.) without breaking. For example, a rectangular flex circuit board 400 may be flexible along a largest surface of the rectangular flex circuit board 400. A rectangular flex circuit board 400 may be flexible and/or rigid along at least a portion of its edges. The flexibility may be achieved as a property of material(s) from which the flex circuit board 400 and/or layers of the flex circuit board 400 is/are formed (e.g., metals, such as copper, copper alloys, niobium, aluminum, etc., dielectric materials, nonmetals, polymers, rubbers, etc.), achieved by hinging and/or segmenting of the flex circuit board 400 (e.g., hinging and/or segmenting a rigid portion), and/or in any other suitable manner. The substrate(s) may be strictly planar (e.g., having a substantially linear cross-section across a length and width) and/or may be generally planar in that the substrate(s) bend, wrinkle, or are otherwise non-linear in at least one cross-section but generally represent a shape having a depth significantly less than (e.g., less than about 10% of) a length and width.

In some embodiments, the flex circuit board 400 can include at least one ground layer 402. The ground layer 402 can form an outer surface of the flex circuit board 400, such as an outer surface along the largest surface. In some embodiments, the flex circuit board 400 can include two ground layers 402, such as two parallel and spaced apart ground layers 402. For instance, the two ground layers 402 can form both largest outer surfaces of the flex circuit board 400. A ground layer 402 can act as an electrical isolation layer to isolate signal lines 406 on one side of the ground layer 402 from interfering signals (e.g., from signal lines 406 on other layers, other boards, the environment, etc.) on another side of the ground layer 402. For instance, the ground layer 402 can be coupled to earth ground and/or other suitable ground(s).

The ground layer(s) 402 can be or can include any suitable electrically conductive material. In some embodiments, the ground layer(s) 402 can be or can include superconducting ground layer(s) 402 including superconducting material(s), such as superconducting material(s) that achieve(s) superconductivity at a temperature below about 3 kelvin, such as about 1 kelvin, such as about 20 millikelvin. As examples, the ground layer(s) 402 can be or can include niobium, tin, aluminum, and/or other suitable superconducting materials. Additionally and/or alternatively, the ground layer(s) 402 can be or can include material having high signal transfer performance characteristics, such as low resistance, low reflectivity, low distortion, etc. such that a signal is substantially unchanged by passing through the signal line. As examples, the ground layer(s) 402 can be or can include copper, gold, and/or other suitable materials having high signal transfer performance characteristics. Additionally and/or alternatively, the ground layer(s) 402 can be or can include material(s) having desirable thermal characteristics, such as suitably high and/or low thermal transfer, such as, for example, copper, copper alloy, etc.

In some embodiments, the flex circuit board 400 can include at least one dielectric layer 404. The dielectric layer(s) 404 can be or can include any suitable dielectric material, such as dielectric polymers. In some embodiments, the dielectric layer(s) 404 can be or can include flexible dielectric material. As one example, the dielectric layer(s) 404 can be or can include polyimide. At least a portion of the dielectric layer(s) 404 can be formed on or otherwise disposed proximate to at least a portion of an inner surface of the ground layer(s) 402. For example, in some embodiments, an inner surface of a ground layer 402 can be mated with an outer surface of a dielectric layer 404. Furthermore, in some embodiments, inner surfaces of two dielectric layers 404 can be mated with signal lines 406 disposed therebetween.

The flex circuit board 400 can include one or more signal lines 406. The one or more signal lines 406 can be disposed on a surface (e.g., an inner surface) of at least one dielectric layer 404. As an example, in some implementations, the one or more signal lines 406 can be disposed between opposing inner surfaces of two dielectric layers 404. The signal line(s) 406 can be or can include any suitable electrically conductive material. In some embodiments, the signal line(s) 406 can be or can include superconducting signal line(s) including superconducting material(s), such as superconducting material(s) that achieve(s) superconductivity at a temperature less than about 3 kelvin, such as less than about 1 kelvin, such as less than about 20 millikelvin. As examples, the signal line(s) 406 can be or can include niobium, tin, aluminum, and/or other suitable superconducting materials. Additionally and/or alternatively, the signal line(s) 406 can be or can include material having high signal transfer performance characteristics. As examples, the signal line(s) 406 can be or can include copper, gold, and/or other suitable materials having high signal transfer performance characteristics. Additionally and/or alternatively, the signal line(s) 406 can be or can include material(s) having desirable thermal characteristics, such as, for example, copper, copper alloy, etc.

FIG. 5 depicts a cross-sectional view of an example flex circuit board 500 according to example embodiments of the present disclosure. The flex circuit board 500 can include various components discussed with reference to flex circuit board 400 of FIG. 4, such as, for example, ground layer(s) 402, dielectric layer(s) 404, and/or signal line(s) 406. Additionally, the flex circuit board 500 can include one or more vias 502. For instance, the via(s) 502 can extend through the ground layer(s) 402, the dielectric layer(s) 404, and/or the signal line(s) 406. The via(s) can serve to improve isolation of the signal lines 406. In some embodiments, the via(s) 502 can be plated with via plate(s) 504 that extend along the via(s) 502. The via plate(s) 504 can be any suitable material. For instance, in some embodiments, the via plate(s) 504 can be or can include conductive material, such as copper.

FIG. 6 depicts a cross-sectional view of an example flex circuit board 600 according to example embodiments of the present disclosure. The flex circuit board 600 can include various components discussed with reference to flex circuit board 400 of FIG. 4, such as, for example, ground layer(s) 402, dielectric layer(s) 404, and/or signal line(s) 406. Additionally, the flex circuit board 600 can include interconnect pads 602. The interconnect pads 602 can couple to conductive material on flex circuit board 600, such as the ground layer(s) 402 and/or signal line(s) 406. Additionally and/or alternatively, via(s) 604 in flex circuit board 600 can be plated with via plate(s) 606. The via plate(s) 606 may be formed of a same material and/or formed concurrently with interconnect pads 602.

In some embodiments, the ground layer(s) 402 and/or signal line(s) 406 can be superconducting material and the interconnect pads 602 can be material such as copper to provide improved interfacing with the superconducting ground layer(s) 402 and/or superconducting signal line(s) 406. For instance, this can resolve some difficulties associated with interfacing with and/or between superconducting materials. In some embodiments, adhesion layers (not illustrated) can be included between the interconnect pads 602 and the conductive material (e.g., the ground layer(s) 402 and/or the signal line(s) 406). In some embodiments, the adhesion layer(s) can be a material that may be different from the material of the ground layer(s) 402 and/or signal line(s) 406 and/or the interconnect pads 602, such as titanium. In some embodiments, the interconnect pads 602 and/or the via plates 606 can be formed of deposited copper, then electroplated copper. For instance, a portion of interconnect pads 602 and/or via plates 606 can first be deposited as a metal film (e.g., additionally to an adhesion layer, in some embodiments), then the remainder of interconnect pads 602 and/or via plates 606 can be electroplated. The interconnect pads 602 and/or via plates 606 may be deposited in a vacuum to prevent contamination of interfaces between the interconnect pads 602 and the flex circuit board 600.

In some embodiments, at least one superconducting layer (e.g., the ground layers 402 and/or signal lines 406) can have a first end and an opposed second end. A first interconnect pad 602 can be disposed on the first end of the at least one superconducting layer. A second interconnect pad 602 can be disposed on the second end of the at least one superconducting layer.

Figure 7:
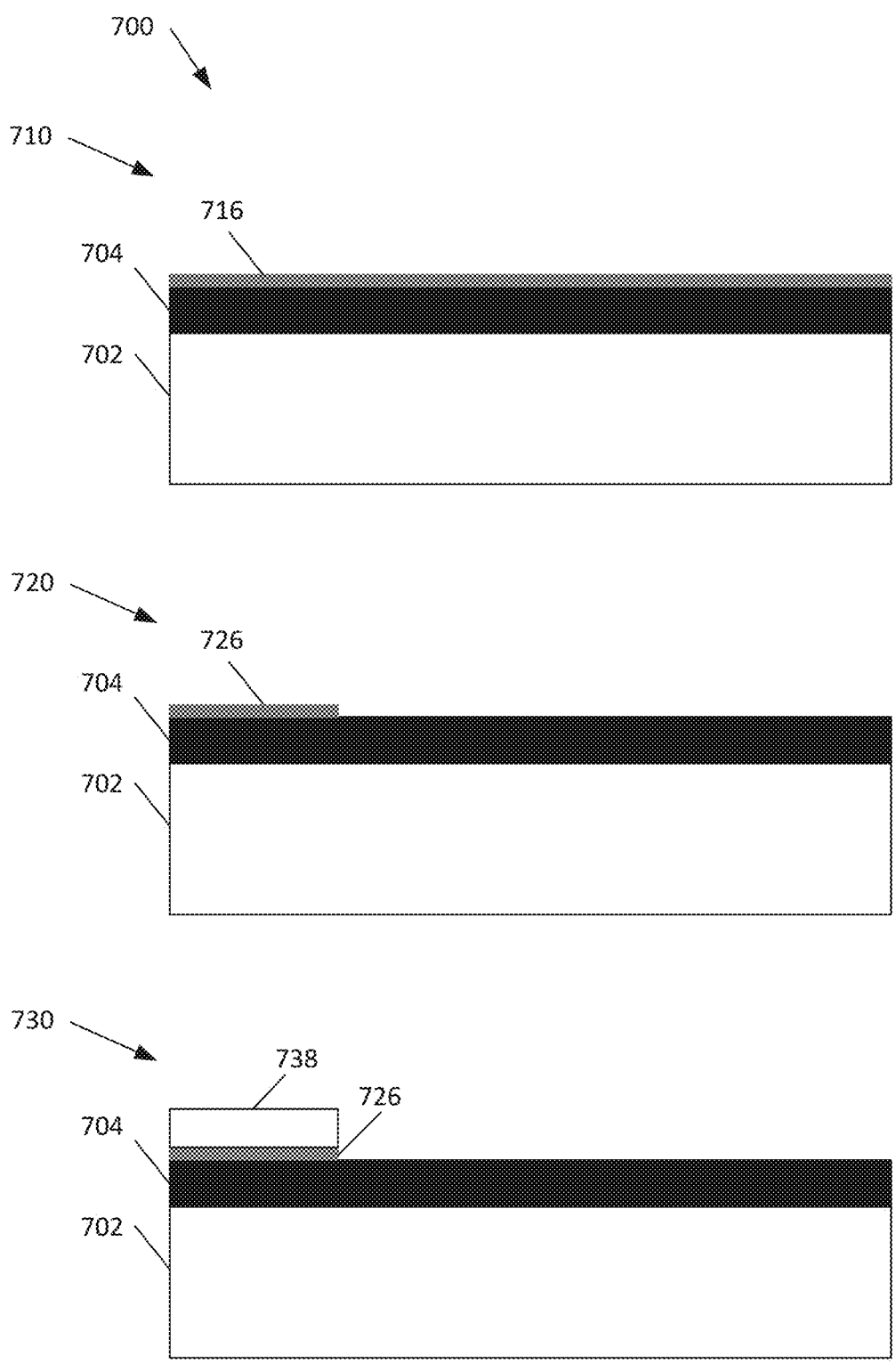
FIG. 7 depicts a flex circuit board at various stages of a manufacturing process according to example embodiments of the present disclosure.

FIG. 7 depicts a flex circuit board at various stages 710, 720, 730 of a manufacturing process 700 according to example embodiments of the present disclosure. More or fewer steps than depicted in FIG. 7 may be performed for manufacturing process 700. In some embodiments, steps 710, 720, and 730 may be performed consecutively. The steps 710, 720, and 730 may be performed without exposure of the superconducting layer to oxygen. For example, each of the steps 710, 720, and 730 can be performed in a vacuum, without breaking the vacuum between the steps. In this way, formation of oxides and/or other contaminants at interfaces of the flex circuit board (e.g., interconnect pads) can be mitigated.

For instance, a first step 710 of manufacturing process 700 can include depositing metal film 716 onto superconducting layer 704. For instance, metal film 716 can be deposited over a larger surface of the superconducting layer 704 than the eventual metal structure 738, such as an entire surface of superconducting layer 704. In some embodiments, the metal film 716 can be deposited proximate an end of the superconducting layer 704. The superconducting layer 704 can be formed on or otherwise disposed on a dielectric layer 702. For instance, in some embodiments, the superconducting layer 704 may be deposited on the dielectric layer 702 prior to step 710. Although metal film 716 is depicted as being deposited on a surface of superconducting layer 704, it should be understood that metal film 716 may be deposited on a via extending through at least superconducting layer 704 and/or dielectric layer 702.

A second step 720 of manufacturing process 700 can include etching metal film 716 to form metal film 726. For instance, metal film 716 can be etched to remove at least a removed portion of metal film 716. A remaining portion of metal film 716 can form metal film 726. For instance, the remaining portion of the metal film 716 (e.g., metal film 726) can be about the size of the eventual metal structure 738. In some embodiments, the metal film 726 can be or include an adhesion layer. For instance, the metal film 726 may include a first layer of a first material (e.g., titanium) and/or a second a layer of a second material (e.g., copper). In some embodiments, one of the first or second layers may be a same material as the metal structure 738 (e.g., copper) such that the metal film 726 forms at least a portion of metal structure 738.

A third step 730 of manufacturing process 700 can include electroplating metal structure 738 on the metal film 726. For instance, in some embodiments, a portion of metal structure 738 can first be deposited on superconducting layer 704 as metal film 726. The remaining portion of metal structure 738 can be electroplated on subsequent to the deposit and etching of metal film 726. In this way, the metal film 726 can act as an adhesion layer to secure metal structure 738 to superconducting layer 704. Additionally, the metal structure 738 and/or metal film 726 can provide quality electrical contact (e.g., noncontaminated electrical contact) to superconducting layer 704, which can assist in interfacing with the superconducting layer 704. The metal structure 738 may be an interconnect pad, a via plate, and/or any other suitable metal structure for interfacing with superconducting layer 704.

Figure 8:
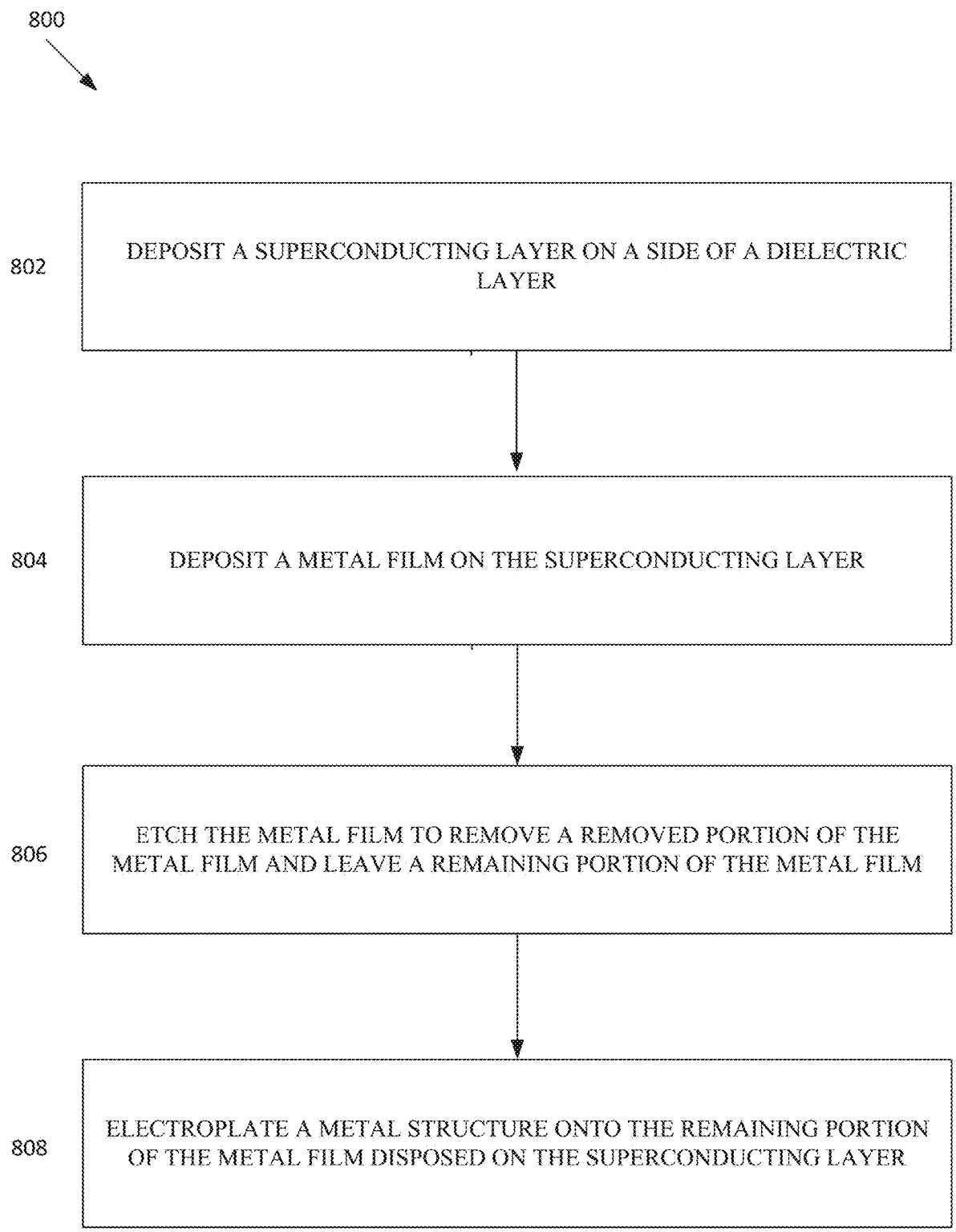
FIG. 8 depicts an example method for making a flex circuit board for use in transmitting signals in a quantum computing system.

FIG. 8 depicts an example method 800 for making a flex circuit board for use in transmitting signals in a quantum computing system. FIG. 8 depicts steps performed in a particular order for purposes of illustration and discussion. Those of ordinary skill in the art, using the disclosures provided herein, will understand that various steps of any of the methods disclosed herein can be adapted, modified, performed simultaneously, omitted, include steps not illustrated, rearranged, and/or expanded in various ways without deviating from the scope of the present disclosure.

The method 800 can include, at 802, depositing a superconducting layer (e.g., a first superconducting layer) on a first side of a dielectric layer (e.g., a first dielectric layer). For example, in some embodiments, the superconducting layer can be a ground layer and/or a superconducting signal line layer including one or more signal lines. The superconducting layer can be or can include superconducting material, such as material that is superconducting at a temperature below about 3 kelvin, such as about 1 kelvin, such as about 20 millikelvin. As one example, the superconducting material may be or include niobium. The dielectric layer can be any suitable dielectric material, such as a flexible dielectric material, such as polyimide.

The method 800 can include, at 804, depositing a metal film (e.g., a first metal film) on the superconducting layer. For instance, the metal film can be deposited over a greater area than an eventual metal structure, such as an entire surface of the superconducting layer. The metal film can include at least one layer. As one example, the metal film can be a same material as the eventual metal structure. As one example, the metal film can be or include copper. For instance, the metal film can be a first portion of the eventual metal structure that is formed by depositing. The metal film can serve to prevent formation of contaminants (e.g., oxides) and/or adhere the metal structure to the superconducting layer. Additionally and/or alternatively, the metal film can include an additional adhesion layer having a different material from the eventual metal structure, such as titanium. The additional adhesion layer can improve adherence of the metal structure and/or metal film to the superconducting layer.

The method 800 can include, at 806, etching the metal film to remove a removed portion (e.g., a first removed portion) of the metal film and to leave a remaining portion (e.g., a first remaining portion) of the metal film. For example, the remaining portion of the metal film may be masked such that only the removed portion of the metal film is etched. The removed portion of the metal film may be etched such that the remaining portion of the metal film is about the same size, shape, and/or area as the metal structure. For example, the etching may trim away unnecessary regions of the metal film.

The method 800 can include, at 808, electroplating a metal structure (e.g., a first metal structure) onto the remaining portion of the metal film. For example, a portion of the metal structure can be first formed as the metal film, and a second portion of the metal structure can be formed by electroplating on top of the metal film. In this way, the metal structure can be adhered to the superconducting material in the superconducting layer, which can provide improved interfacing with the superconducting layer. The metal structure can be formed of any suitable material, such as copper. The metal structure can be, for example, an interconnect pad, a via plate, and/or any other suitable metal structure.

The method 800 can be repeated for any suitable number of layers in the flex circuit board. As one example, the method 800 can additionally include, depositing a second superconducting layer on a second side of the first dielectric layer. For example, the first superconducting layer may be a ground layer and the second superconducting layer may be a signal line layer. The second side of the first dielectric layer can be opposite the first side of the first dielectric layer. The method 800 can additionally include depositing a second metal film on the second superconducting layer. The method 800 can additionally include etching the second metal film to remove a second removed portion of the second metal film and to leave a second remaining portion of the second metal film. The method 800 can additionally include electroplating a second metal structure onto the second remaining portion of the second metal film disposed on the second superconducting layer. The method 800 can additionally include depositing a second dielectric layer on the second superconducting layer. The method 800 can additionally include depositing a third superconducting layer on the second dielectric layer. For example, the third superconducting layer may be a second ground layer. The method 800 can additionally include depositing a third metal film on the third superconducting layer. The method 800 can additionally include etching the third metal film to remove a third removed portion of the third metal film and to leave a third remaining portion of the third metal film. The method 800 can additionally include electroplating a third metal structure onto the third remaining portion of the third metal film disposed on the third superconducting layer. In this way, the method 800 can provide for a superconducting flex circuit board that includes interconnect pads and/or via plates for each of two ground layers and a signal line layer.

In some embodiments, to provide a metal structure for a via, the method 800 can include etching a via through each of the layers (e.g., the dielectric layers, ground layer(s), and/or signal lines) and depositing the metal film an inner surface of the via. The metal structure (e.g., via plate) can then be electroplated on the metal film in the inner surface of the via. In this way, the metal film and/or the metal structure can extend through each layer.

In some embodiments, the method 800 can be performed without exposing the flex circuit board to oxygen. For instance, in some embodiments, depositing the first metal film on the superconducting layer is performed without exposure of the superconducting layer to oxygen. As one example, the flex circuit board including the superconducting layer and the dielectric layer can be disposed in a vacuum prior to depositing the first metal film. The vacuum may be maintained until the risk of oxygen contamination is removed, such as until the metal structure is successfully electroplated on.

Figure 9:
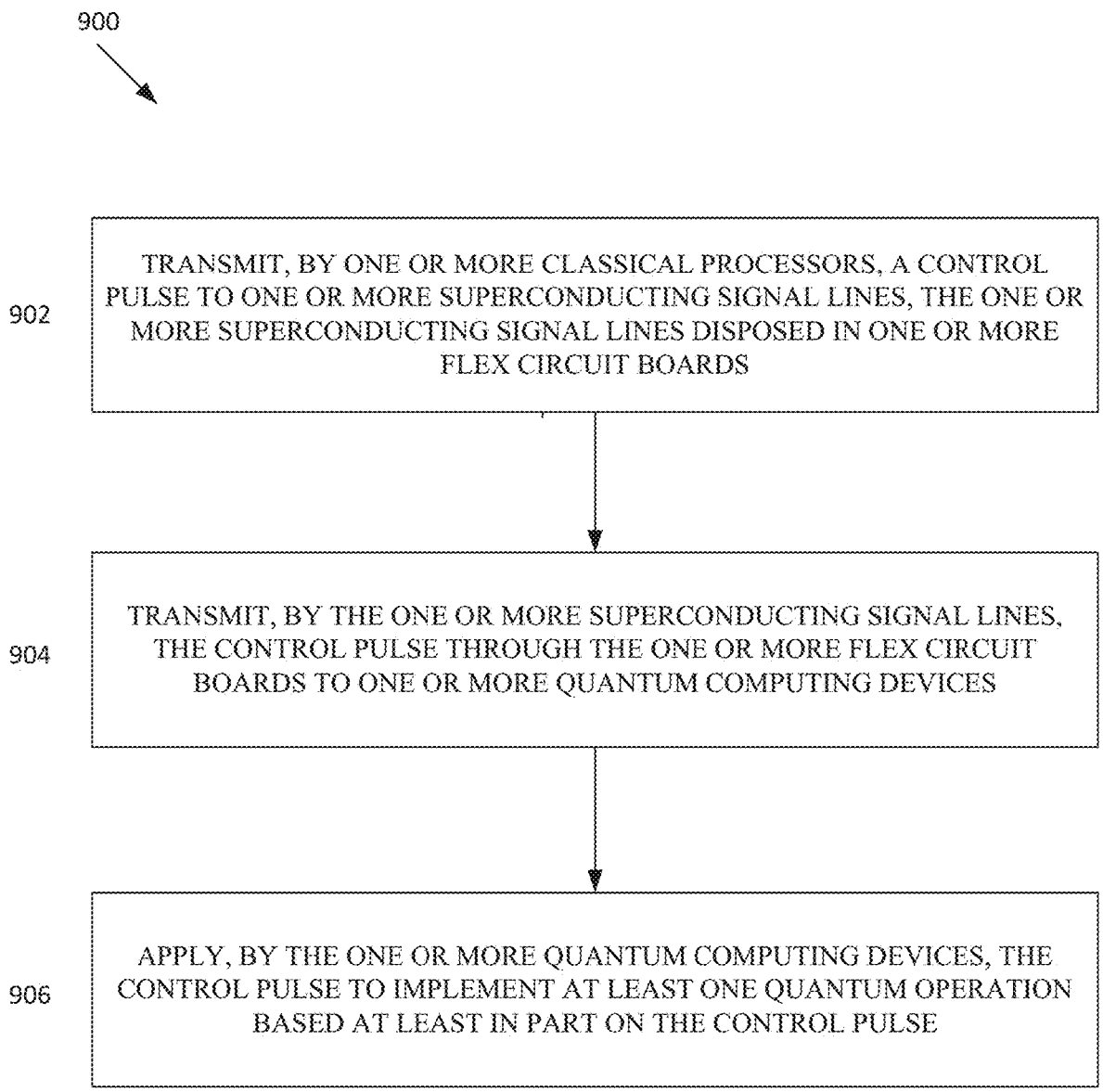
FIG. 9 depicts an example method of operating a quantum computing system including flex circuit boards according to example embodiments of the present disclosure.

FIG. 9 depicts an example method of operating a quantum computing system including flex circuit boards according to example embodiments of the present disclosure. The method 900 can be implemented using any suitable quantum computing system, such as any of the quantum computing systems 100 or 300 depicted in FIGS. 1-3. FIG. 9 depicts steps performed in a particular order for purposes of illustration and discussion. Those of ordinary skill in the art, using the disclosures provided herein, will understand that various steps of any of the methods disclosed herein can be adapted, modified, performed simultaneously, omitted, include steps not illustrated, rearranged, and/or expanded in various ways without deviating from the scope of the present disclosure.

The method 900 can include, at 902, transmitting a control pulse to one or more signal lines. For example, the control pulse can be transmitted by one or more classical processors coupled to the signal line(s). The control pulse can be or can include classical (e.g., binary) computer-readable signal data, such as a voltage signal, and/or signals that are implementable by quantum computing devices. The signal line(s) can be disposed in one or more flex circuit boards. The flex circuit boards can include at least one metal structure electroplated onto the at least one superconducting signal lines, as described herein. For example, the flex circuit boards can be any suitable flex circuit boards discussed herein, such as flex circuit boards 400, 500, and/or 600 of FIGS. 4-6. The flex circuit boards may be disposed in any suitable quantum computing system, such as quantum computing systems 100 and/or 300 of FIGS. 1-3.

The method 900 can include, at 904, transmitting the control pulse through the one or more flex circuit boards to one or more quantum computing devices. For example, the control pulse can be transmitted through the signal line(s) in the one or more flex circuit boards to the quantum computing device(s). The control pulse can be transmitted, by the signal line(s), through a temperature gradient in a vacuum chamber. For instance, the signal line(s) carrying the control pulse can be progressively decreasing in temperature from the classical processor(s) (e.g., at room temperature and/or a temperature on the order of about 100 kelvin) to the quantum computing device(s) (e.g., at a temperature of less than about 1 kelvin, such as about 10 mK).

The method 900 can include, at 906, applying the control pulse to implement at least one quantum operation based at least in part on the control pulse. As one example, in some embodiments, the quantum operation(s) can be or can include obtaining state measurement(s) of the quantum computing device(s). For instance, the control pulse can instruct the quantum computing device(s) to measure the quantum state and/or resolve the quantum state to a basis state representation. Additionally, the measured quantum state can be transmitted (e.g., by the signal lines) to the classical processor(s).

As another example, in some embodiments, the quantum operation(s) can be or can include implementing at least one quantum gate operation by and/or at the quantum computing device(s). For instance, the control pulse can be descriptive of microwave pulses that are applied to the quantum computing device(s) (e.g., qubits) to perform quantum gating operations. Example quantum gating operations include, but are not limited to, Hadamard gates, controlled-NOT (CNOT) gates, controlled-phase gates, T gates, multi-qubit quantum gates, coupler quantum gates, etc.

Implementations of the digital and/or quantum subject matter and the digital functional operations and quantum operations described in this specification can be implemented in digital electronic circuitry, suitable quantum circuitry or, more generally, quantum computational systems, in tangibly-implemented digital and/or quantum computer software or firmware, in digital and/or quantum computer hardware, including the structures disclosed in this specification and their structural equivalents, or in combinations of one or more of them. The term "quantum computing systems" may include, but is not limited to, quantum computers/computing systems, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits/qubit structures, or a combination of one or more of them. Alternatively or in addition, the program instructions can be encoded on an artificially-generated propagated signal that is capable of encoding digital and/or quantum information (e.g., a machine-generated electrical, optical, or electromagnetic signal) that is generated to encode digital and/or quantum information for transmission to suitable receiver apparatus for execution by a data processing apparatus.

The terms quantum information and quantum data refer to information or data that is carried by, held, or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states (e.g., qudits) are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, or multiple digital and quantum processors or computers, and combinations thereof. The apparatus can also be, or further include, special purpose logic circuitry, e.g., an FPGA (field programmable gate array), or an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL, Quipper, Cirq, etc.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers or processors to be "configured to" or "operable to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof.

Some example elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or electronic system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A flex circuit board for use in transmitting signals in a quantum computing system, the flex circuit board comprising:
   at least one dielectric layer; and
   at least one superconducting layer disposed on a surface of the at least one dielectric layer, the at least one superconducting layer comprising a superconducting material, the superconducting material being superconducting at a temperature less than about 3 kelvin;
   wherein the flex circuit board has at least one metal structure that is electroplated onto the at least one superconducting layer, the at least one metal structure is configured to couple the at least one superconducting layer to another structure that is external to the flex circuit board, and the at least one metal structure is a via plate, the via plate coating a via extending through at least the at least one dielectric layer and the at least one superconducting layer.

2. The flex circuit board of claim 1, wherein the superconducting material comprises niobium.

3. The flex circuit board of claim 1, wherein the at least one dielectric layer comprises polyimide.

4. The flex circuit board of claim 1, wherein the at least one metal structure comprises copper.

5. The flex circuit board of claim 1, wherein:
   the at least one superconducting layer comprises:
      a first ground layer;
      a second ground layer; and
      a signal line layer disposed between the first ground layer and the second ground layer, the signal line layer comprising one or more signal lines;

the at least one dielectric layer comprises:
a first dielectric layer disposed between the first ground layer and the signal line layer; and
a second dielectric layer disposed between the second ground layer and the signal line layer.

6. The flex circuit board of claim 1, further comprising at least one adhesion layer disposed between the at least one superconducting layer and the at least one metal structure.

7. The flex circuit board of claim 6, wherein the at least one adhesion layer is formed by etching a deposited metal film.

8. The flex circuit board of claim 6, wherein the at least one adhesion layer comprises titanium.

9. The flex circuit board of claim 6, wherein the at least one adhesion layer comprises copper.

10. A flex circuit board for use in transmitting signals in a quantum computing system, the flex circuit board comprising:
at least one dielectric layer; and
at least one superconducting layer disposed on a surface of the at least one dielectric layer, the at least one superconducting layer comprising a superconducting material, the superconducting material being superconducting at a temperature less than about 3 kelvin;
wherein the flex circuit board has at least one metal structure that is electroplated onto the at least one superconducting layer, the at least one metal structure is configured to electrically couple the at least one superconducting layer to another structure that is external to the flex circuit board, and the at least one metal structure is an interconnect pad.

11. The flex circuit board of claim 10, wherein the interconnect pad is configured to couple to at least one signal line of the superconducting layer.

12. The flex circuit board of claim 11, wherein the at least one superconducting layer has a first end and an opposed second end, wherein a first interconnect pad is disposed on the first end of the at least one superconducting layer and a second interconnect pad is disposed on the second end of the at least one superconducting layer.

13. The flex circuit board of claim 11, further comprising at least one adhesion layer disposed between the at least one superconducting layer and the at least one metal structure.

14. A flex circuit board for use in transmitting signals in a quantum computing system, the flex circuit board comprising:
at least one dielectric layer; and
at least one superconducting layer disposed on a surface of the at least one dielectric layer, the at least one superconducting layer comprising a first ground layer, a second ground layer, a signal line layer disposed between the first ground layer and the second ground layer, and a superconducting material, the superconducting material being superconducting at a temperature less than about 3 kelvin;
wherein the flex circuit board has at least one metal structure that is electroplated onto the at least one superconducting layer, the at least one metal structure is configured to couple the at least one superconducting layer to another structure that is external to the flex circuit board, and the at least one metal structure comprises a plurality of interconnect pads that are disposed on each end of the first ground layer, the second ground layer, and the signal line layer.

15. The flex circuit board of claim 14, wherein the at least one dielectric layer comprises:
a first dielectric layer disposed between the first ground layer and the signal line layer; and
a second dielectric layer disposed between the second ground layer and the signal line layer.

16. The flex circuit board of claim 14, further comprising at least one adhesion layer disposed between the at least one superconducting layer and the at least one metal structure.

17. A flex circuit board for use in transmitting signals in a quantum computing system, the flex circuit board comprising:
at least one adhesion layer that is disposed between the at least one superconducting layer and the at least one metal structure;
at least one dielectric layer; and
at least one superconducting layer disposed on a surface of the at least one dielectric layer, the at least one superconducting layer comprising a superconducting material, the superconducting material being superconducting at a temperature less than about 3 kelvin;
wherein the flex circuit board has at least one metal structure that is electroplated onto the at least one superconducting layer, and the at least one metal structure is configured to electrically couple the at least one superconducting layer to another structure that is external to the flex circuit board.

18. The flex circuit board of claim 17, wherein the at least one adhesion layer is formed by etching a deposited metal film.

19. The flex circuit board of claim 17, wherein the at least one adhesion layer comprises titanium.

20. The flex circuit board of claim 17, wherein the at least one adhesion layer comprises copper.

* * * * *